(12) United States Patent
Yamazaki et al.

(10) Patent No.: US 7,248,614 B2
(45) Date of Patent: Jul. 24, 2007

(54) LASER BEAM GENERATING UNIT

(75) Inventors: Tsunehiko Yamazaki, Aichi-ken (JP); Naoomi Miyagawa, Gifu-ken (JP)

(73) Assignee: Yamazaki Mazak Kabushiki Kaisha, Aichi-ken (JP)

( * ) Notice: Subject to any disclaimer, the term of this patent is extended or adjusted under 35 U.S.C. 154(b) by 314 days.

(21) Appl. No.: 11/063,182

(22) Filed: Feb. 20, 2005

(65) Prior Publication Data

US 2005/0185566 A1 Aug. 25, 2005

(30) Foreign Application Priority Data

Feb. 24, 2004 (JP) ............................ 2004-048283
Mar. 4, 2004 (JP) ............................ 2004-061255

(51) Int. Cl.
*H01S 3/03* (2006.01)
*G02B 6/04* (2006.01)

(52) U.S. Cl. ........................................ 372/64; 385/115

(58) Field of Classification Search .................. 372/64; 385/115

See application file for complete search history.

(56) References Cited

U.S. PATENT DOCUMENTS

| 4,820,010 | A |   | 4/1989 | Scifres et al. |
| 5,325,458 | A | * | 6/1994 | Morrow et al. ............. 385/125 |
| 5,448,587 | A |   | 9/1995 | Huang et al. |
| 5,729,646 | A | * | 3/1998 | Miyagi et al. ............... 385/125 |
| 5,852,692 | A | * | 12/1998 | Nightingale et al. .......... 385/43 |

FOREIGN PATENT DOCUMENTS

| EP | 0 676 653 A | 10/1995 |
| EP | 1 343 036 A | 9/2003 |
| EP | 1 367 679 A | 12/2003 |
| EP | 1 376 179 A | 1/2004 |
| EP | 05101364 | 6/2005 |
| JP | 07 168040 A | 7/1995 |
| JP | 2002-289016 | 10/2002 |
| JP | 2003075658 | 3/2003 |
| JP | 2003-100123 | 4/2003 |
| JP | 2003100123 | 4/2003 |
| JP | 2003-075658 | 12/2003 |

OTHER PUBLICATIONS

Pat Abs. of Japan, Nov. 30, 1995, vol. 1995, No. 10, claims 1-8.

* cited by examiner

*Primary Examiner*—Armando Rodriguez
(74) *Attorney, Agent, or Firm*—Duane Morris, LLP

(57) ABSTRACT

A laser beam generating unit has a semiconductor laser unit having a plurality of beam emitting portions located in the shape of a matrix, and a plurality of optical fibers for individually transmitting laser beam emitted from the beam emitting portions. An optical fiber bundle is formed by binding a plurality of the optical fibers on a side where laser beam emits, and laser beam is emitted through a taper adaptor provided on the side where laser beam emits. Then, laser beam can be transmitted by the optical fibers at a good condition, and can be collected by a beam transmitting path of the adaptor having the thinner diameter with high efficiency and the power density can be raised.

4 Claims, 19 Drawing Sheets

(a)

(b)

(c)

LASER BEAM GENERATING UNIT

BACKGROUND OF THE INVENTION

This invention relates to a laser beam generating unit for collecting laser beam emitted from a plurality of beam emitting portions (emitters) of a semiconductor laser in order to utilize for desired usage.

Generally, a semiconductor laser (laser diode: LD) is known as a source of laser beam having high conversion efficiency from electricity into light, and the efficiency of laser beam exceeding 50 percent, and then, a big scale of cooling unit is not necessary. Therefore, the semiconductor laser is utilized in the field of information processing industry since it can be made compact. But, this semiconductor laser has not been used in the field of machining with laser beam since the size of laser beam of this semiconductor laser is 1 mm or lower at the most and only several watt (W) of beam output is expected although the semiconductor laser has high efficiency of laser beam.

In recent years, a semiconductor laser beam collecting machine to be used for machining with laser beam by using a plurality of semiconductor lasers which are one-dimensionally or two-dimensionally arranged has been planned (see FIGS. 1 through 3 of the Japanese patent application (Publication No.H07-168040). This semiconductor laser collecting machine can obtain high output of laser beam having high light density since a plurality of semiconductor lasers are used although output of laser beam from one semiconductor laser is small.

This semiconductor laser beam collecting machine disclosed in this patent application collects laser beam emitted from the respective beam emitting portions which are sources of laser beam of a semiconductor laser substrate through a beam guiding path formed at the substrate so as to raise the output in order to utilize machining with laser beam. The beam guiding path has input ports having the same number as the sources of laser beam at one end, and all of the laser beam received at each input port is transmitted for only one output port which is formed at the other end.

According to the above-mentioned semiconductor laser beam collecting machine, a relatively big basic plate having a beam guiding path is necessary to be separately prepared in order to collect laser beam emitted from a plurality of beam emitting portions. Dew to the presence of such a basic plate, the machine is not made compact.

Then, an attention is paid to such a structure that laser beam is collected from each of beam emitting ends of the optical fiber bundle which is made by binding a plurality of optical fibers without using the above-mentioned substrate. In such a case, the diameter of the bound portion of the optical fiber bundle is big. In order to collect lower output of laser beam from many beam emitting portions and obtain high output of laser beam, the number of the optical fibers increases, and invites power density down. For this reason, it is desired to make the diameter of the optical fiber bundle smaller on the beam emitting side if the optical fibers are used as the laser beam collecting means.

Then, laser beam generating units for collecting laser beam emitted from each of beam emitting portions with high efficiency by a combination of laser beam collecting means and a taper beam transmitting path are still desired.

SUMMARY OF THE INVENTION

One aspect of the invention is laser beam generating unit having a semiconductor laser unit equipped with a plurality of beam emitting portions arranged in the shape of a matrix, each beam emitting portion being capable of emitting laser beam, and a laser beam collecting means for collecting laser beam emitted from a plurality of said beam emitting portions, comprising:

an emission entrance through which said laser beam collected by said laser beam collecting means enters therein, an emission exit corresponding to said emission entrance, and a taper portion having a taper beam transmitting path formed so as to gradually have a thinner diameter from said emission entrance for said emission exit.

The expression "in the shape of a matrix" in the invention does not always means so-called arrangement in the shape of a matrix where pitches of a line direction and a column direction are corresponded with each other, but includes arrangements having a broad meaning, such as an arrangement in the shape of a honeycomb where a plurality of portions arranged at a predetermined pitch in a line direction (or in a column direction) are shifted from the portions in the column direction (or in the line direction), an arrangement in the shape of a zigzag, and the other arrangements.

Another aspect of the invention is the laser beam generating unit, wherein a shape of a cross section of said laser beam collected by said laser beam collecting means is equal to a shape of said emission entrance opening or smaller.

According to this aspect of the invention, the beam transmitting path which is a path of laser beam has a taper shape so as to gradually have a thinner diameter from the emission entrance for the emission exit, thereby raising the power density of laser beam. Besides, there are the following effects. That is, the beam emitting portions are arranged in the shape of a matrix, a honeycomb, or a zigzag, so that the laser beam is emitted from a plurality of beam emitting portions as it is in the shape of a matrix. That is, the shape of the cross section of a group of laser beam which is emitted from a plurality of beam emitting portions (the shape of the cross section of the area where the laser beam emitted from a plurality of beam emitting portions disperses) is almost rectangular, and the shape of the cross section of the beam transmitting path is generally smaller than the shape of the cross section of a group of the laser beam, which is generally a circle. If the laser beam emitted from the beam emitting portions is entered into the beam transmitting path without collecting the laser beam, a part of the laser beam may not enter the beam transmitting path and may be lost. According to the invention, but, the laser beam emitted from a plurality of the beam emitting portions is collected by the laser beam collecting means which is located between the beam emitting portions and the beam transmitting path, and thereafter, is entered into the emission entrance, so that beam loss can be decreased (can be prevented, preferably) and the laser beam can be effectively utilized.

Another aspect of the invention is the laser beam generating unit, wherein a degree of narrowing a diameter of said laser beam near said emission exit of said beam transmitting path is smaller than a degree of narrowing said diameter of said laser beam near said emission entrance of said beam transmitting path. The expression "the degree of narrowing the diameter of laser beam in some section" in the specification means a value (a ratio) obtained by dividing "the diameter of laser beam emitted from some section" by "the diameter of laser beam which enters some section".

According to this aspect of the invention, the degree of narrowing the diameter of the laser beam near the emission exit of the beam transmitting path is smaller than the degree of narrowing the diameter of the laser beam near the emission entrance of the beam transmitting path, so that the diameter of laser beam can be narrowed in steps, thereby obtaining laser beam optimum for machining in various kinds of meanings.

Another aspect of the invention is the laser beam generating unit, wherein said laser beam collecting means is an optical fiber bundle made by binding a plurality of optical fibers for individually transmitting laser beam respectively emitted from a plurality of beam emitting portions on a side where said laser beam is emitted, which is opposite to a laser beam receiving end facing a plurality of said beam emitting portions.

According to this aspect of the invention, a plurality of optical fibers are used as the laser beam collecting means, and the taper portion is provided on the side where laser beam is emitted and the laser beam is emitted through this taper portion. Then, the laser beam emitted from each of the beam emitting portions can be collected with high efficiency by the taper portion the diameter of which is narrowed, and the power density can be raised on the basis of such a principle that coherent laser beam can transmit in the taper beam guide path which is inclined at a predetermined angle, being reflected, with no beam loss.

Another aspect of the invention is the laser beam generating unit, wherein said laser beam collecting means is a lens.

According to this aspect of the invention, the laser beam collecting means is a lens, thereby simplifying its structure and its manufacturing routine in comparison with the optical fibers.

Another aspect of the invention is the laser beam generating unit, wherein said taper portion is made of a metal material, and said beam transmitting path has a taper hollow portion an inner face of which is polished.

According to this aspect of the invention, the taper portion is made of a metal material, and the beam transmitting path has the taper hollow portion an inner face of which is polished, so that a good beam transmitting path having no beam loss can be easily obtained only by forming a taper hole and polishing the inner face in the shape of a mirror having no irregularity.

Another aspect of the invention is the laser beam generating unit, wherein said taper portion is made of a metal material, and said beam transmitting path has a taper hollow portion at an inner face of which a reflecting film is formed.

According to this aspect of the invention, the taper portion is made of a metal material, and the beam transmitting path has the taper hollow portion at an inner face of which a reflecting film is formed, so that a good beam transmitting path having no beam loss can be easily obtained only by forming a taper hole and forming a reflecting film having no irregularity at its inner face.

Another aspect of the invention is the laser beam generating unit, wherein said taper portion is made of a synthetic resin material, and said beam transmitting path has a taper hollow portion at an inner face of which a metal reflecting film is formed by evaporation-plating.

According to this aspect of the invention, the taper portion is made of a synthetic resin material, and the beam transmitting path has the taper hollow portion at an inner face of which a metal reflecting film is formed by evaporation-plating, so that a good beam transmitting path having no beam loss can be easily obtained only by forming a taper hole and finishing the inner face in the shape of a mirror having no irregularity by evaporation-plating. Besides, the taper portion may be made of a glass material. In such a case, the same effects can be also obtained by forming a metal reflecting film on the inner face of the beam transmitting path by evaporation-plating.

DESCRIPTION OF THE PREFERRED EMBODIMENTS

The following is an explanation of respective embodiments of the invention.

The First Embodiment

Figure 1:
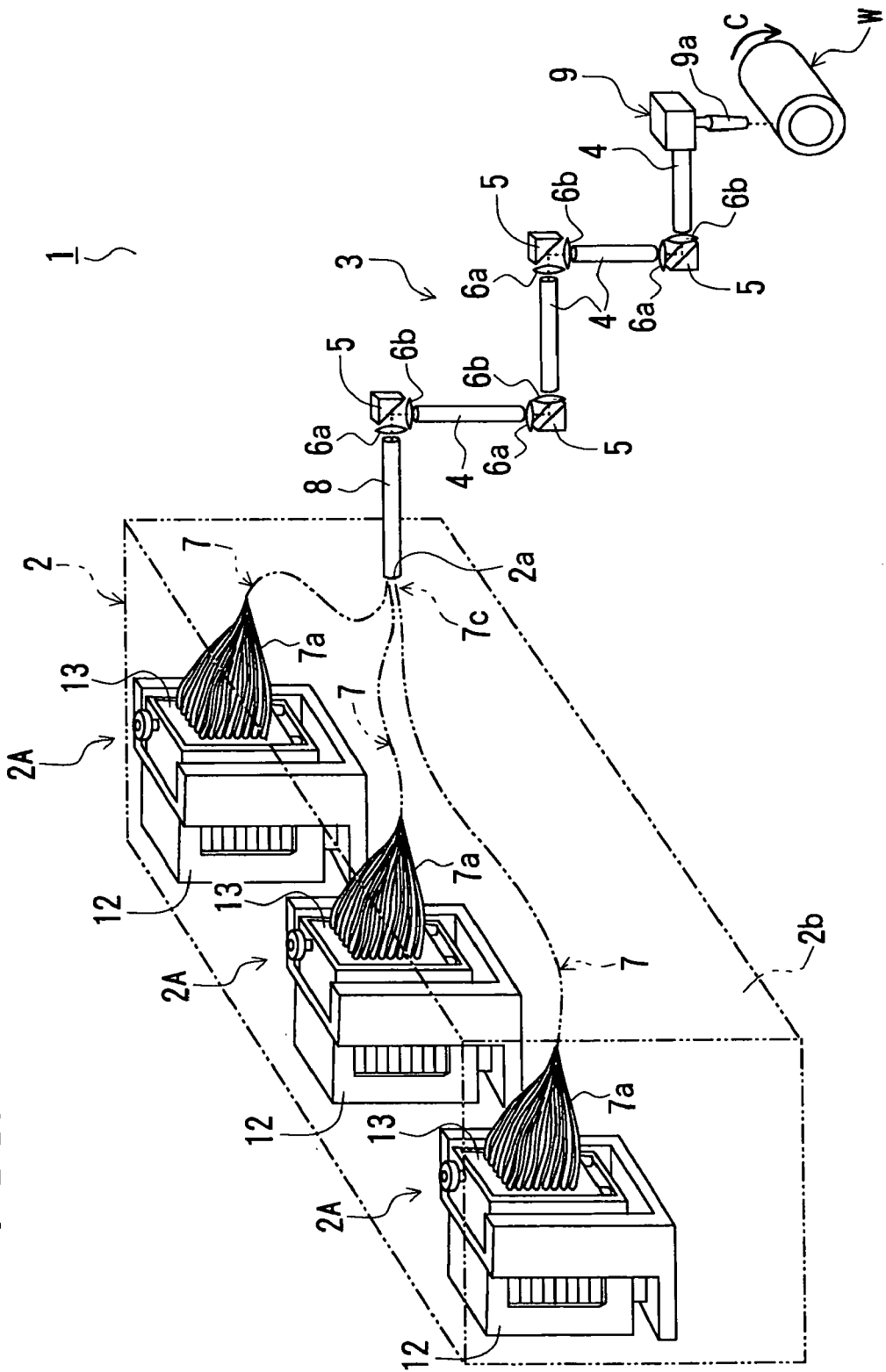
FIG. 1 is a perspective view schematically showing the whole machine tool having a laser beam generating unit to which the invention is applied.
Figure 2:
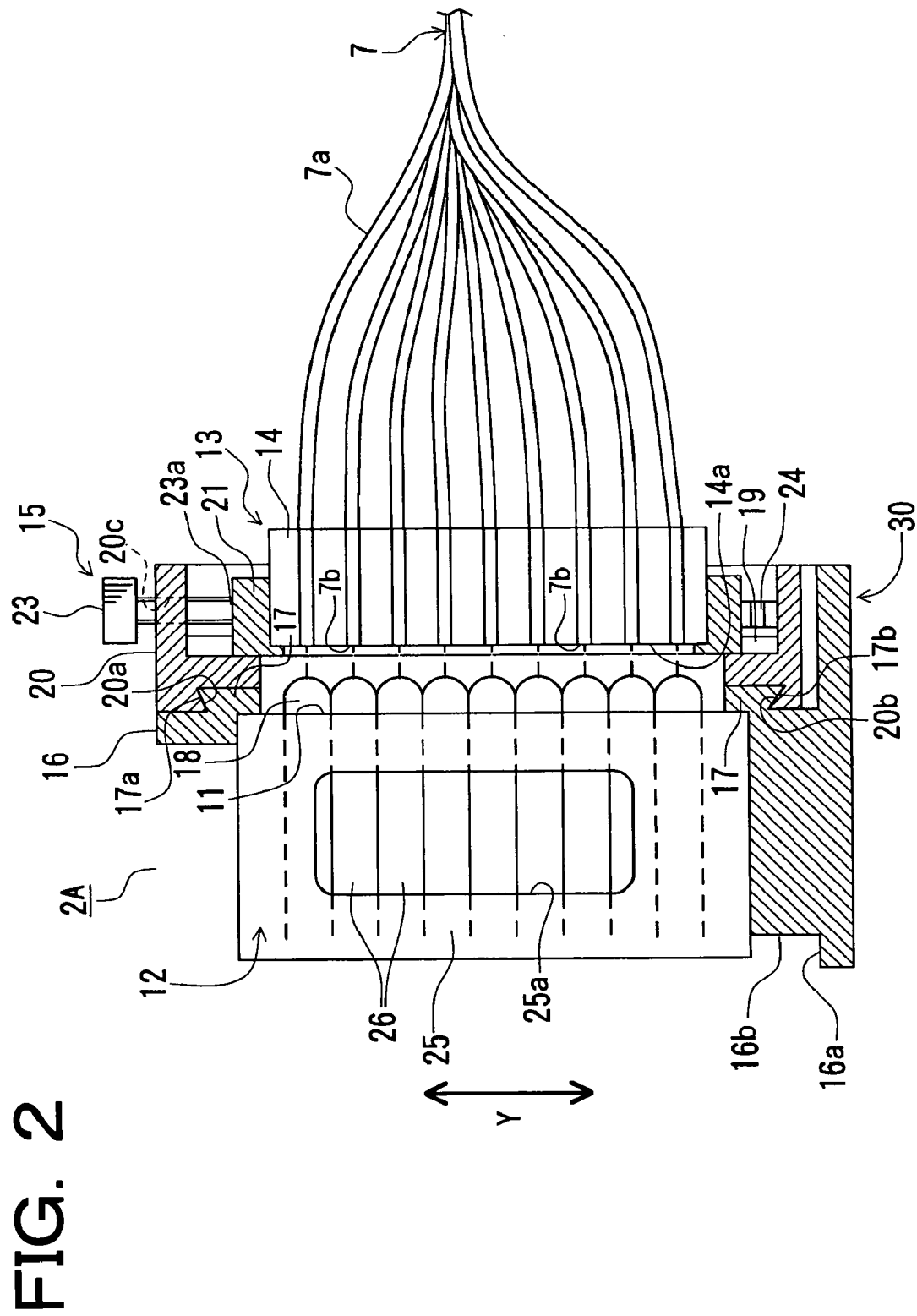
FIG. 2 is a cross section of a side of one laser beam generating unit in FIG. 1.
Figure 3:
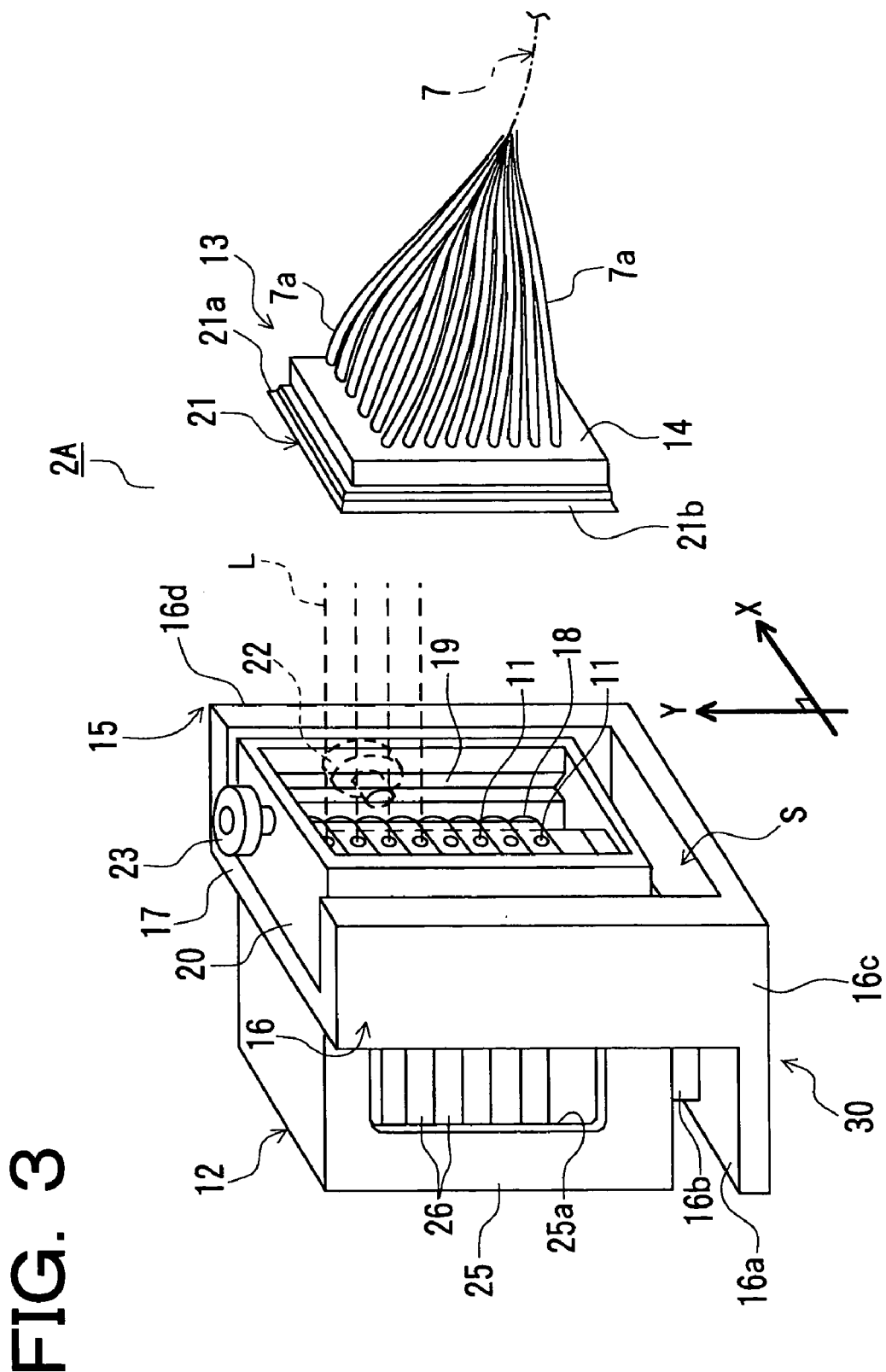
FIG. 3 is a perspective view showing one laser beam generating unit of FIG. 1 including a part exploded.

The first embodiment of the invention is now explained, referring to the appended drawings FIGS. 1 through 3.

FIG. 1 is a perspective view schematically showing the whole machine tool having a laser beam generating unit to which the invention is applied, FIG. 2 is a cross section of a side of one laser beam generating unit in FIG. 1, and FIG.

3 is a perspective view showing one laser beam generating unit of FIG. 1 including a part exploded.

As shown in FIG. 1, a machine tool 1 has a laser beam generating unit 2 for generating laser beam, a laser beam transmitting unit 3 for transmitting laser beam outputted from the laser beam generating unit 2 to a machining portion, and a laser beam radiating unit 9 for radiating transmitted laser beam from a torch 9a on a workpiece W.

The laser beam generating unit 2 of the machine tool 1 is comprised of a plurality of laser beam generating units 2A, each having a semiconductor laser unit 12, a hardened resin 14 (see FIGS. 2 and 3), and an optical fiber unit 13 comprised of end portions of optical fibers 7a formed in the shape of a block by the hardened resin 14.

In this embodiment, the laser beam generating unit 2 has three laser beam generating units 2A, but the number of the laser beam generating units 2A is optional, such as one, two, or four or more. That is, the number of the units 2A is properly selected according to volume of output of laser beam necessary for each usage.

The laser beam generating unit 2 has a main body case 2b having a through hole 2a on its side, and three laser beam generating units 2A are stored and located inside the main body case 2b. Laser beam outputted from each laser beam generating unit 2A is transmitted to an optical fiber 8 which projects outside the case from the through hole 2a, via an optical fiber bundle 7 which is comprised of a plurality of optical fibers 7a. Laser beam is collected from an aggregate of a plurality of optical fiber bundles 7 through an optical system (not shown) and enters the optical fiber 8.

The laser beam transmitting unit 3 has the optical fiber 8 and four optical fibers 4 having a structure similar to the optical fiber 8. Between the optical fiber 8 and the optical fibers 4, mirrors 5 are respectively located. Such a problem that laser beam leaks out of the optical fibers 4, 8 in the laser beam transmitting unit 3 when bending the fibers a predetermined angle or more (such as 8°) is solved by optically connecting two fibers through the mirror 5, so that a path of transmitting laser beam can be freely designed.

A convex lens 6a is located between an end portion on a side of output of laser beam ("the output side end portion" hereinafter) in the optical fibers 8, 4 and the mirror 5, and a convex lens 6b is located between an end portion on a side of input of laser beam ("the input side end portion" hereinafter) in the optical fibers 4 and the mirror 5. The laser beam which is emitted (oscillated) from each laser beam generating unit 2A and transmitted through the optical fiber bundles 7 and the optical fiber 8 diffuses when outputted from the output side end portion of the optical fiber 8. But, the diffused laser beam is converted into a parallel beam by the convex lens 6a, and thereafter, is reflected by the mirror 5, so that the direction of the laser beam changes a predetermined angle.

And, the parallel beam reflected by the mirror 5 is collected so as to be smaller than a diameter of a core member (not shown) owned by the optical fibers 8, 4 by refraction of the lens 6b, and is inputted in the core member of the input side end portion. Then, the laser beam diffused from one core member of the optical fibers 8, 4 is collected and inputted into the core member of the other optical fiber 4.

When emitting laser beam from the laser beam generating unit 2 with the above-mentioned structure, the laser beam is transmitted to a laser beam radiating unit 9 through the laser beam transmitting unit 3, and is radiated on the workpiece W from the torch 9a so as to focalize the laser beam with respect to the workpiece W through a lens (not shown) located in the torch 9a.

Then, laser beam can be equally radiated on a surface of the workpiece when rotating the workpiece W in an arrow C direction of FIG. 1 at a predetermined speed. In case of the workpiece W made of steel, hardening machining can be executed on a portion 1.0 mm-1.5 mm from the surface of the workpiece W. The machine tool 1 is shown in FIG. 1 only in order to explain the path of transmitting laser beam, so that a table, a driving unit for the table, and the other portions are omitted.

Subsequently, a structure of the laser beam generating unit 2 (2A) is explained, referring to FIGS. 2 and 3. As shown in FIGS. 2 and 3, each of the laser beam generating units 2A comprising the laser beam generating unit 2 has the semiconductor laser unit 12 having a plurality of laser beam emitting portions 11 which are located in the shape of a matrix, each laser beam emitting portion 11 emitting laser beam L, and a plurality of optical fibers 7a for individually transmitting the laser beam L which is emitted from each laser beam emitting portion 11.

The expression "in the shape of a matrix" in this embodiment does not always means so-called arrangement in the shape of a matrix where pitches of a line direction (X direction) and a column direction (Y direction) are corresponded with each other, but includes arrangements having a broad meaning, such as an arrangement in the shape of a honeycomb where a plurality of portions arranged at a predetermined pitch in a line direction (or in a column direction) are shifted from the portions in the column direction (or in the line direction), an arrangement in the shape of a zigzag, and the other arrangements.

The semiconductor laser unit 12 is comprised of a plurality of semiconductor laser substrates 26 (nine, for instance) which are stacked up, each having a plurality of beam emitting portions (emitters) 11 arranged at a front face of the semiconductor laser unit 12 in the X direction, and is stored in a heat sink 25 having box-like shape. Each semiconductor laser substrate 26 has a microlens 18 arranged so as to cover each beam emitting portion 11. The microlens 18 is for converting laser beam into parallel beam, and is a cylindrical lens or so. A notch for heat release 25a formed in the shape of almost rectangular shape is formed at both sides of the heat sink 25 (only on side is shown in FIGS. 2 and 3).

The semiconductor laser substrate 26 is one made by connecting a p-type layer and a n-type layer having an activated layer therebetween. At a side of the activated layer, a plurality of beam emitting portions (emitters), capable of oscillating laser beam on the basis of voltage of the p-type layer and the n-type layer, are arranged in the X direction (see FIG. 3). In such a semiconductor laser substrate 26, the laser beam L (FIG. 3) is emitted from each beam emitting portion 11 when voltage is applied to the p-type layer and the n-type layer through an electrode (not shown).

A plurality of optical fibers 7a are positioned and fixed by a glass system of hardened resin 14 in a predetermined length from each top end of the optical fiber 7a so as to form a block so that each of the beam emitting portions 11 having a matrix shape can correctly face each beam receiving end 7b (see FIG. 2) and each pitch of the beam receiving end 7b in the X direction and in the Y direction can correspond to each pitch between the beam emitting portions 11 in the X direction and in the Y direction with one to one. As mentioned before, the optical fiber unit 13 is comprised of the hardened resin 14 and the end portions of the optical fibers 7a which are formed in a block by the hardened resin 14.

The optical fiber unit 13 takes the form of a rectangular parallelopiped which is relatively thin in a front/rear direction (in a thickness direction) in such a manner that the beam receiving ends 7b of a predetermined number of optical fibers 7a (such as 54 (6×9) ) are positioned and hardened with resin, and thereafter, a front end face 14a (see FIG. 2) of the hardened resin 14 is accurately polished so as to be strictly parallel to each beam receiving end 7b of the optical fiber 7a. If the optical fiber unit 13 having such a structure is used, many optical fibers 7a can be correctly positioned at a one time such that the front end face 14a is a standard with respect to the arrangement of the beam emitting portions 11.

In this embodiment, the semiconductor laser unit 12 has nine steps of the semiconductor laser substrates 26 and six beam emitting portions 11 formed in each semiconductor laser substrate 26. But, the number of the beam emitting portions 11 owned by one semiconductor laser substrate 26 or the number of steps of the semiconductor laser substrates 26 can be properly changed.

And, a Y-direction movement frame 21 is fitted onto a periphery of the front end face 14a of the optical fiber unit 13. The Y-direction movement frame 21 which supports the optical fiber unit 13 is engaged with Y-direction rails 19, 19, which are formed inside a X-direction movement frame 20, and movably supported by both rails 19, 19 in the Y direction. And, the Y-direction movement frame 21 has engagement convex portions 21a, 21b, capable of slidably engaging with the Y-direction rails 19, 19, at one side and the other side.

Between the semiconductor laser unit 12 and the optical fiber unit 13, a positioning adjustment means 15 for correctly adjusting a positional relation between the beam emitting portion 11 and the beam receiving end 7b to be positioned facing each other is located. The positioning adjustment means 15 is comprised of the Y-direction movement frame 21 installed on the optical fiber unit 13, and a supporting body 30 for supporting the Y-direction movement frame 21 on a side of the semiconductor laser unit 12.

The supporting body 30 has a support base 16 for fixedly supporting the semiconductor laser unit 12 in a predetermined state, and the X-direction movement frame 20 movably supported by the support base 16 in the X direction. The support base 16 has a base portion 16a, and a pedestal portion 16b for supporting the semiconductor laser unit 12 which is formed at an almost central portion of the base portion 16a.

And, the support base 16 has pole portions 16c, 16d extending in up/down direction (Y direction) having a predetermined space therebetween on a front side of the base portion 16a (the right side of FIG. 3), and beam portions 17, 17 extending so as to connect upper portions of the pole portions 16c, 16d and to connect lower portions of the pole portions 16c, 16d. As shown in FIG. 2, X-direction rails 17a, 17b extending in a direction of a length of the beam portion are respectively formed at the beam portions 17 on the upper side and the lower side. That is, the X-direction rails 17a, 17b are arranged, having a predetermined space in the up/down direction of the front face of the semiconductor laser unit 12 (the face on the side of emitting beam), and the Y-direction rails 19, 19 (one side is omitted in the figure for convenience) are arranged, having a predetermined space in the right/left direction of the front face of the side of emitting beam.

And, a tapped hole (now shown) is formed at a predetermined position of the pole portion 16d so as to face the X direction. A X-direction adjusting screw 22, for adjusting a position of the X-direction movement frame 20 with respect to the support base 16 in the X-direction, is fitted in the tapped hole. An end portion of the X-direction adjusting screw 22 abuts on one side of the X-direction movement frame 20.

The X-direction movement frame 20 is formed so as to have almost rectangular shape and to have a space wherein the Y-direction movement frame 21 can move a predetermined distance in the X direction and in the Y direction in a space S between the pole portions 16c, 16d of the support base 16. The X-direction movement frame 20 has engagement ditches 20a, 20b capable of slidably engaging with the X-direction rails 17a, 17b such that a space of a central portion of the frame 20 is positioned at the front face of the semiconductor laser unit 12, a tapped hole 20c (see FIG. 2) formed at a predetermined position of the movement frame 20 so as to face the Y direction, and an Y-direction adjusting screw 23 for adjusting a position in the Y direction of the Y-direction movement frame 21 with respect to the X-direction movement frame 20 by fitting in the tapped hole 20c. An end portion 23a of the Y-direction adjusting screw 23 is abutted on an upper side face of the Y-direction movement frame 21 which is held in a central space of the X-direction movement frame 20.

A spring member (not shown), such as a plate spring and a coiled spring are formed between the pole portion 16c and the X-direction movement frame 20 so as to shrink. Then, a X direction adjusting mechanism is structured, through which the position in the X direction of the X-direction movement frame 20 (that is, the optical fiber unit 13) can be adjusted by rotationally moving the X-direction adjusting screw 22 with a rotational axis as its center in a direction and in the other direction so as to press or release the side of the X-direction movement frame 20. Besides, as shown in FIG. 2, a spring member 24, such as a plate spring and a coiled spring is formed between a bottom face of the X-direction movement frame 20 and a lower side of the Y-direction movement frame 21 so as to shrink. Then, a Y direction adjusting mechanism is structured, through which the position in the Y direction of the Y-direction movement frame 21 (that is, the optical fiber unit 13) can be adjusted by rotationally moving the Y-direction adjusting screw 23 in a direction and in the other direction so as to press or release the upper side of the Y-direction movement frame 21.

Respective members comprising the present laser beam generating unit 2A are structured such that necessary portion thereof can be separated and assembled with a screw or the like as a matter of convenience of assemble work or installation of the optical fiber unit 13 on the supporting body 30 although the figures does not show.

In the machine tool 1, the output of the laser beam emitted from each beam emitting portion 11 of the semiconductor laser unit 12 is small (1 w or so, for instance). But, in each laser beam generating unit 2A, the semiconductor laser unit 12 is comprised of nine steps of the semiconductor laser substrates 26 which are stacked, the substrate 26 having a plurality of beam emitting portions 11, each capable of emitting laser beam L. Then, it is possible to obtain high output of laser beam necessary for machining on the workpiece W by collecting large volume of the laser beam L from the semiconductor laser unit 12. When providing a plurality of the laser beam generating units 2A, as shown in FIG. 1, the higher output of laser beam can be obtained utilizing many semiconductor laser units 12 in such a machine tool 1.

At the time of an assemble operation of the machine tool 1, the optical fiber unit 13 is assembled on the supporting body 30 in a state of FIG. 2. That is, the engagement convex portions 21a, 21b of the Y-direction movement frame 21 are slidably engaged with the Y-direction rails 19, 19 by a predetermined operation, facing the front end face 14a of the optical fiber unit 13 installing the Y-direction movement frame 21 in advance to the beam emitting portions 11 of the semiconductor laser unit 12 exposing from the X-direction movement frame 20.

Subsequently, in order to adjust the positioning of the beam emitting portions 11 of the thus assembled laser beam generating unit 2A and the beam receiving ends 7b in the X direction and in the Y direction, the laser beam L which is emitted from a plurality of beam emitting portions 11 and transmitted through the optical fiber bundle 7 is displayed on a monitor (not shown) so as to watch the state. The X-direction movement frame 20 which supports the optical fiber unit 13 through the Y-direction movement frame 21 is slightly moved with respect to the support base 16 which supports the semiconductor laser unit 12 in the X direction, and the Y-direction movement frame 21 which supports the optical fiber unit 13 is slightly moved with respect to the X-direction movement frame 20 in the Y direction when properly rotationally gradually moving the X-direction adjusting screw 22 and the Y-direction adjusting screw 23 in a proper direction according to the state watched on the monitor.

In the laser beam generating unit 2 (2A) provided at the machine tool 1, positions of the beam receiving ends 7b of the optical fiber unit 13 with respect to many beam emitting portions 11 in the X direction and in the Y direction can be collectively adjusted with a high accuracy by properly rotationally moving the X-direction adjusting screw 22 and the Y-direction adjusting screw 23.

Subsequently, a structure of the optical fiber bundle 7 is now explained in detail.

Figure 4:
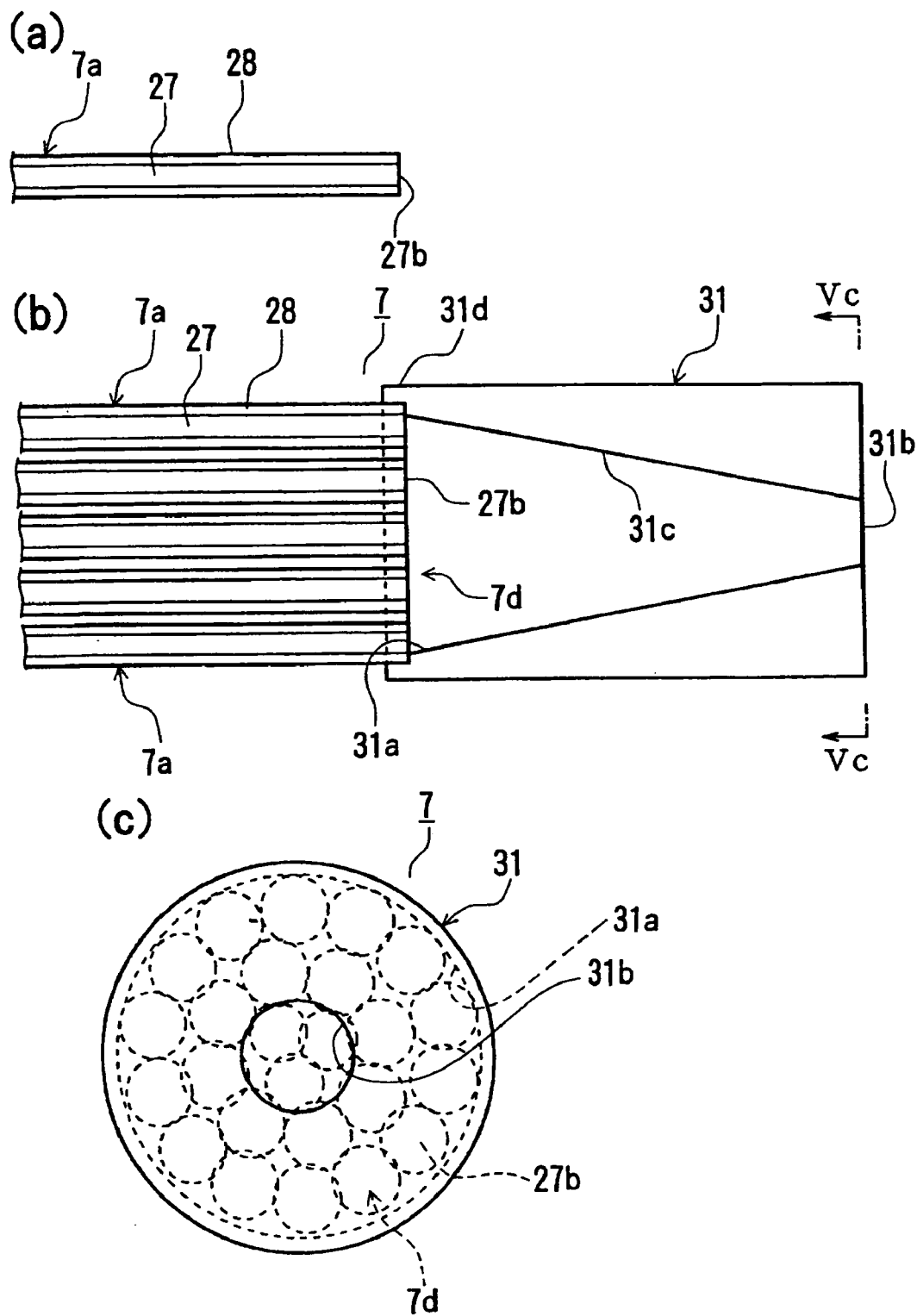
FIG. 4 is one instance of optical fibers wherein (a) is a side view showing one optical fiber enlarged, (b) is a side view showing an end portion of an optical fiber bundle made by binding a plurality of optical fibers and an adaptor enlarged, and (c) is a front view showing a state seen from line $V_c$-$V_c$.

FIG. 4 is one instance of optical fibers wherein (a) is a side view showing one optical fiber enlarged, (b) is a side view showing an end portion of an optical fiber bundle made by binding a plurality of optical fibers and an adaptor enlarged, and (c) is a front view showing a state seen from line $V_c$-$V_c$ of FIG. 4(b).

In this embodiment, an adaptor 31 which is a taper portion is connected with the end portions of the optical fibers 7a comprising the optical fiber bundle 7 without machining the top end portion of each optical fiber 7a.

In this embodiment, an emission end 27b of the optical fiber 7a which is comprised of a core 27 and a clad 28 has a shape similar to the beam receiving end 7b, as shown in FIG. 4(a). As shown in FIG. 4(b) (c), a plurality of optical fibers 7a (the number is fifty four, for instance) are bound in one (on the side where laser beam emits which is opposite to the side of the beam receiving ends 7b facing a plurality of beam emitting portion 11) so as to form the optical fiber bundle 7. And, the optical fiber bundles 7 of the respective laser beam generating units 2A are bound so as to form the optical fiber bundle 7 (54×3, for instance) having a bigger diameter.

In this embodiment, the expression "the optical fiber bundle 7" of each laser beam generating unit 2A is used for one made by binding three optical fiber bundles 7. The number of the optical fibers 7a in FIG. 4(b), (c) does not correspond to one of the actual optical fibers.

The adaptor 31 which is the taper portion is connected with an emission end 7d, which is a portion through which laser of the whole optical fiber bundle 7 emits. As shown in FIG. 4(b), the adaptor 31 has almost cylindrical shape, and the adaptor 31 is connected with the optical fiber bundle 7 such that a connecting portion 31d projecting in the shape of like cylinder on the emission end 7d side is inserted into an outer peripheral portion of the emission end 7d, facing a side of emission entrance 31a the inner diameter of which is bigger than an emission exit 31b to the emission end 7d of the optical fiber bundle 7. The adaptor 31 is strongly fixed by the outer peripheral portion of the emission end 7d through a fixing means (not shown).

The adaptor 31 which is the taper portion has the emission entrance 31a facing the emission end 7d, the emission exit 31b corresponding to the emission entrance 31a, and a beam transmitting path 31c connecting the emission entrance 31a and the emission exit 31b with each other. The beam transmitting path 31c is tapered, having gradually thinner diameter from the side of the emission entrance 31a for the emission exit 31b. In this embodiment, the shape of the opened emission entrance 31 is a circle as shown with a reference number 31a of FIG. 4(c). A plurality of small circles shown with a broken line inside the circle 31a shows a shape of a cross section of the optical fiber 7a, so that the shape of the cross section of laser beam collected by the optical fiber bundle 7 is an aggregate of concentric circles which are smaller than the respective small circles. In the end, the shape of the cross section of the laser beam collected by the optical fiber bundle 7 is smaller than the shape of the emission entrance opening in this embodiment. With such a structure, all the laser beam L emitted from each optical fiber 7a of the optical fiber bundle 7 can be transmitted with no beam loss, being reflected by the inner face of the beam transmitting path 31c. With such a structure, the optical fiber bundle 7 can function as means for collecting laser beam, for collecting the laser beam L emitted from a plurality of beam emitting portions 11 and entering into the emission entrance 31a.

The adaptor 31 is made of a metal material, such as aluminum, and the beam transmitting path 31c has a taper hollow portion formed so as to penetrate and so as to have gradually thinner diameter from the side of the emission entrance 31a of the adaptor 31 for the side of the emission exit 31b. The inner peripheral face of the beam transmitting path 31c is strictly polished in order to save beam loss at the time of transmitting of laser beam as much as possible so as to have a flat face having no irregularity. Alternatively, a reflecting film for throughout transmitting laser beam is formed on the inner peripheral face of the beam transmitting path 31c which is made of a metal material by a plating (coating) in order to save beam loss at the time of transmitting of laser beam as much as possible.

When using the optical fiber bundle 7 in this embodiment for the laser beam generating unit 2 (2A) the laser beam L emitted from many beam emitting portions 11 can be collected with high efficiency, and can be entered into the optical fiber 8 (see FIG. 1) raising the power density due to presence of the adaptor 31 which is the taper portion. Besides, the beam emitting portions 11 in this embodiment are located in the shape of a matrix, the laser beam emitted from a plurality of beam emitting portions 11 is emitted in the shape of a matrix as it is. That is, the shape of the cross section of a group of the laser beam which is emitted from a plurality of beam emitting portions (in other words, the shape of the cross section of the area where the laser beam L emitted from a plurality of beam emitting portions distributes) is almost rectangular shape, and the shape of the cross section of the beam transmitting path 31c (the shape of the emission entrance opening) is a small circle. According to this embodiment, the optical fiber bundle 7 is located between the beam emitting portions 11 and the beam transmitting path 31c so that the laser beam emitted from a plurality of beam emitting portions 11 can be collected by the bundle 7 and enters in the emission entrance 31a. Therefore, it is possible to avoid beam loss (beam leakage at the time of enter of laser beam from the optical fiber bundle 7 into the beam transmitting path 31c) and to effectively utilize laser beam. Besides, according to this embodiment, the means for collecting laser beam are a plurality of optical fibers 7a, and the taper adaptor 31 is provided at the side of emitting laser beam, and the laser beam is emitted through the adaptor 31. Then, the laser beam emitted from each laser beam emitting portion can be collected with high efficiency by the adaptor which diameter is narrowed so as to improve power density on the basis of such a principle that coherent laser beam can transmit in the taper beam guide path which is inclined at a predetermined angle, being reflected, with no beam loss.

In addition, with a simple routine wherein a plurality of optical fibers 7a are bound on the side of emitting laser beam so as to from the optical fiber bundle 7 and the emission end 7d of the bundle 7 is connected with the adaptor 31, the laser beam L can be effectively collected in order to obtain high output of laser beam for machining with laser beam although individual laser beam L is a lower output. Furthermore, the adaptor 31 is made of a metal material, and the beam transmitting path 31c has the taper hollow portion, the inner face of which is polished, thereby easily obtaining the good beam transmitting path 31c with no beam loss if a taper hole is only formed at the adaptor 31 and its inner face is only polished in the shape of a mirror having no irregularity.

The adaptor 31 may be made of a strong synthetic resin material, such as a glass and transparent plastic, not of a metal material. That is, with a glass or a synthetic resin material, the adaptor 31 is formed so as to have a shape similar to a case where a metal material is used, and thereafter, a metal reflecting film, such as gold and silver, is formed on the inner peripheral face of the beam transmitting path 31c by vacuum evaporation plating. Then, the adaptor 31 is structured with a glass or a synthetic resin material, and the beam transmitting path 31c is comprised of the taper hollow portion, at the inner face of which a metal reflecting film is formed by evaporation plating, thereby easily obtaining the good beam transmitting path 31c with no beam loss if a taper hole is only formed at the adaptor 31 and its inner face is only finished in the shape of a mirror by evaporation plating with no irregularity.

In FIG. 4(b), the adaptor 31 is connected with the emission end 7d of the optical fiber bundle 7, but both the adaptor 31 and the optical fiber bundle 7 may not be connected with each other. For instance, both the adaptor 31 and the optical fiber bundle 7 may be supported by the same case or base plate so that the emission entrance 31a of the adaptor 31 and the emission end 7d of the optical fiber bundle 7 are faced each other.

As clear from FIG. 4(b), the diameter of the beam transmitting path 31c of the adaptor 31 in this embodiment is narrowed from the emission entrance 31a for the emission exit 31b at the same inclination (at the same rate) (that is, a degree of narrowing a diameter of laser beam is the same from the emission entrance 31a to the emission exit 31b). But, the degree of narrowing the diameter of laser beam near the emission exit 31b of the beam transmitting path 31c may be made smaller than the degree of narrowing the diameter of laser beam near the emission entrance 31a. In such a case, the diameter of laser beam can be narrowed in stages, thereby obtaining laser beam optimum for machining in various kinds of meanings. The expression "the degree of narrowing the diameter of laser beam in some section" in the specification means a value (a ratio) obtained by dividing "the diameter of laser beam emitted from some section" by "the diameter of laser beam which enters some section".

The Second Embodiment

Figure 5:
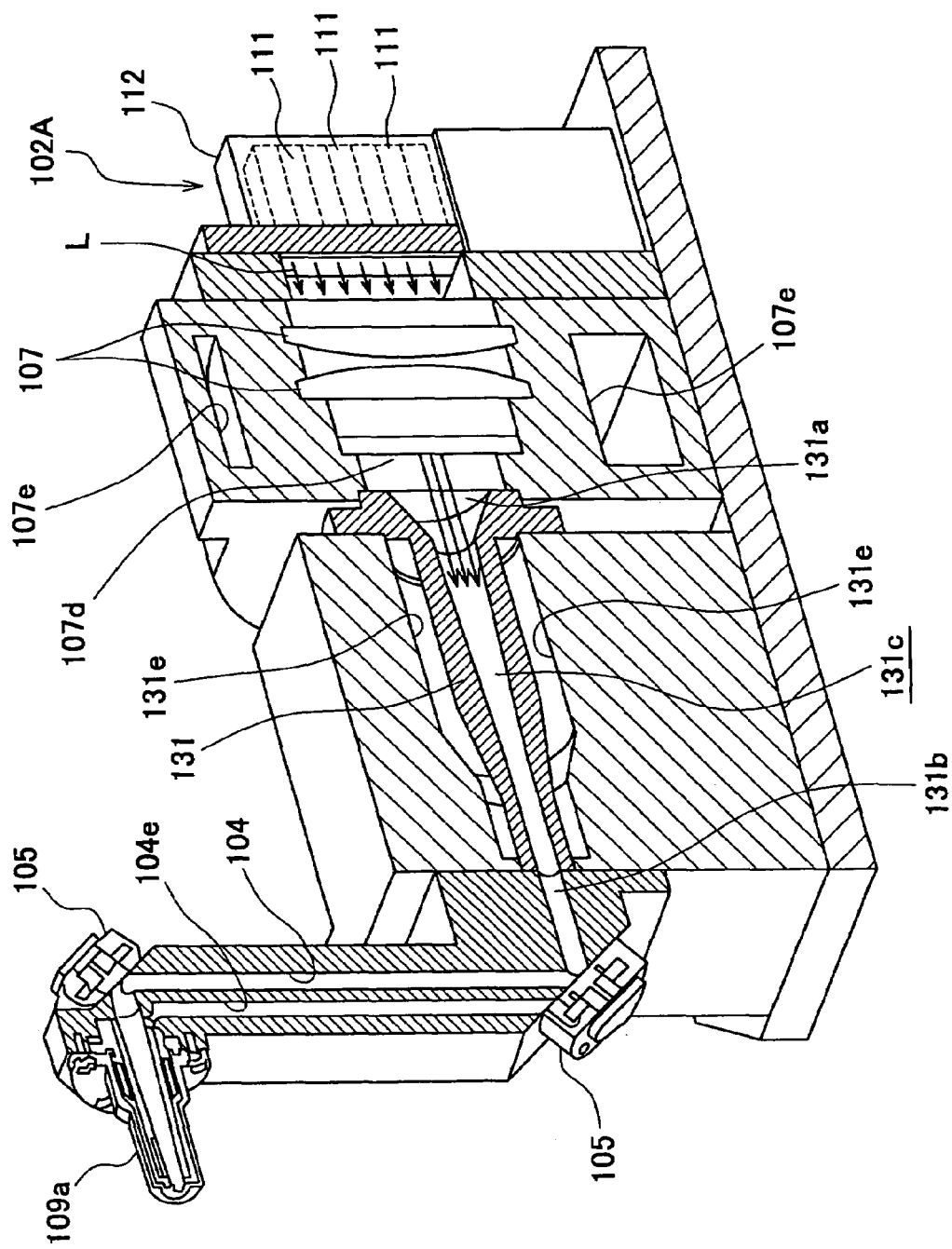
FIG. 5 is a perspective sectional view schematically showing another machine tool having the laser beam generating unit to which the invention is applied.

The second embodiment of the invention is now explained, referring to FIG. 5.

In the first embodiment, means for collecting laser beam (that is, means for collecting laser beam L emitted from a plurality of beam emitting portions 11) is the optical fiber bundle 7 having a plurality of the optical fibers 7a. But, the means for collecting laser beam in this embodiment are lens 107 as shown in FIG. 5, thereby simplifying its structure and its manufacturing routine in comparison with the optical fibers. FIG. 5 is a perspective sectional view schematically showing another machine tool having the laser beam generating unit to which the invention is applied.

In FIG. 5, a reference number 111 denotes a beam emitting portion for emitting the laser beam L, and a reference number 112 denotes a semiconductor laser unit having a plurality of the beam emitting portions 111 arranged in the shape of a matrix, and a reference number 102A denotes a laser beam generating unit.

A reference number 131c is a taper beam transmitting path formed so as to gradually have a thinner diameter, and a reference number 131a denotes an emission entrance of laser beam which is located at a position facing an emission end 107d of the laser beam collecting means 107, and a reference number 131b denotes an emission exit corresponding to the emission entrance 131a. The parts 131 (a taper portion) having the emission entrance 131a, the emission exit 131b and the beam transmitting path 131c may have a structure similar to the adaptor 31. That is, the taper portion 131 may be made of a metal material, and the beam transmitting path 131c may have a taper hollow portion inner face of which is polished. Alternatively, the taper portion 131 may be made of metal material, and the beam transmitting path 131c may have a taper hollow portion at an inner face of which a reflecting film is formed. Furthermore, the taper portion 131 may be made of a synthetic resin material, and the beam transmitting path 131c may have a taper hollow portion at an inner face of which a metal reflecting film is formed by evaporation plating. The structures of the other parts may be similar to ones in the first embodiment.

The beam emitting portions 111 in this embodiment are arranged in the shape of a matrix, so that the laser beam L in the shape of a matrix is emitted from a plurality of beam emitting portions 111 as it is. That is, a shape of a cross section of a group of laser beam which is comprised of laser beam emitted from a plurality of the beam emitting portions 111 (in other word, the shape of the cross section of the area where laser beam emitted from a plurality of the beam emitting portions 111 distribute) is almost rectangular. On the other hand, the shape of the cross section of the beam transmitting path 131c (the shape of the emission entrance opening) is a small circle. According to this embodiment, lens 107 are arranged between the beam emitting portions 111 and the beam transmitting path 131c so that the laser beam emitted from a plurality of the beam emitting portions 111 is collected by the lens 107 and enters the emission entrance 131a, thereby avoiding beam loss (that is, beam to be leaked at the time when laser beam enters into the beam transmitting path 131c from the lens 107, and effectively utilizing laser beam. The lens 107 to be used in this embodiment may collect a group of laser beam which broadly distributes in an area having an almost rectangular shape into an area of a small circle, or into an area having similar shape (that is, the area having a small rectangular shape) In this case, preferably, the shape of the cross section of the laser beam collected by the lens 107 is equal to the shape of the emission entrance opening or smaller.

A microlens (not shown in FIG. 5, see a reference number 18 of FIG. 2) may be located so as to cover each beam emitting portion 111 so that the microlens can convert laser beam into parallel beam. Besides, the lens 107 may collect laser beam so as to be parallel to an optical axis in addition to only collecting laser beam from a plurality of the beam emitting portions 111. In such a case, beam loss (irregular reflection) in the beam transmitting path 131c can be reduced.

In this embodiment, a degree of narrowing the diameter of laser beam near the emission exit 131b of the beam transmitting path 131c is smaller than a degree of narrowing the diameter of laser beam near the emission entrance 131a of the beam transmitting path 131c, as clear from FIG. 5. Then, the diameter of laser beam can be narrowed in stages, thereby obtaining laser beam optimum for machining in various kinds of meanings.

The Third Embodiment

The third embodiment of the invention is now explained, referring to the appended drawings FIGS. 6 through 19.

Figure 6:
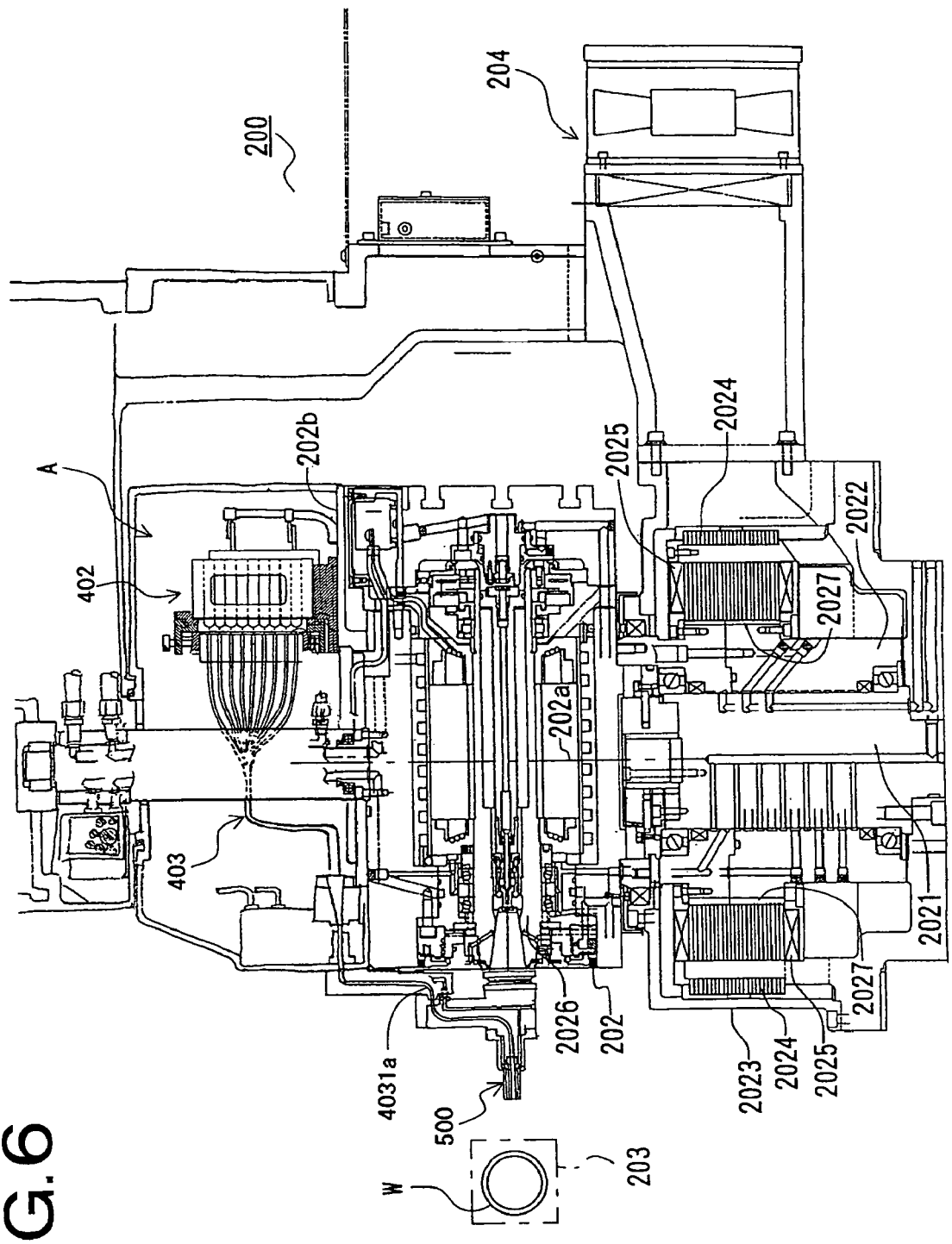
FIG. 6 is a sectional view showing a structure of the machine tool according to the invention.
Figure 7:
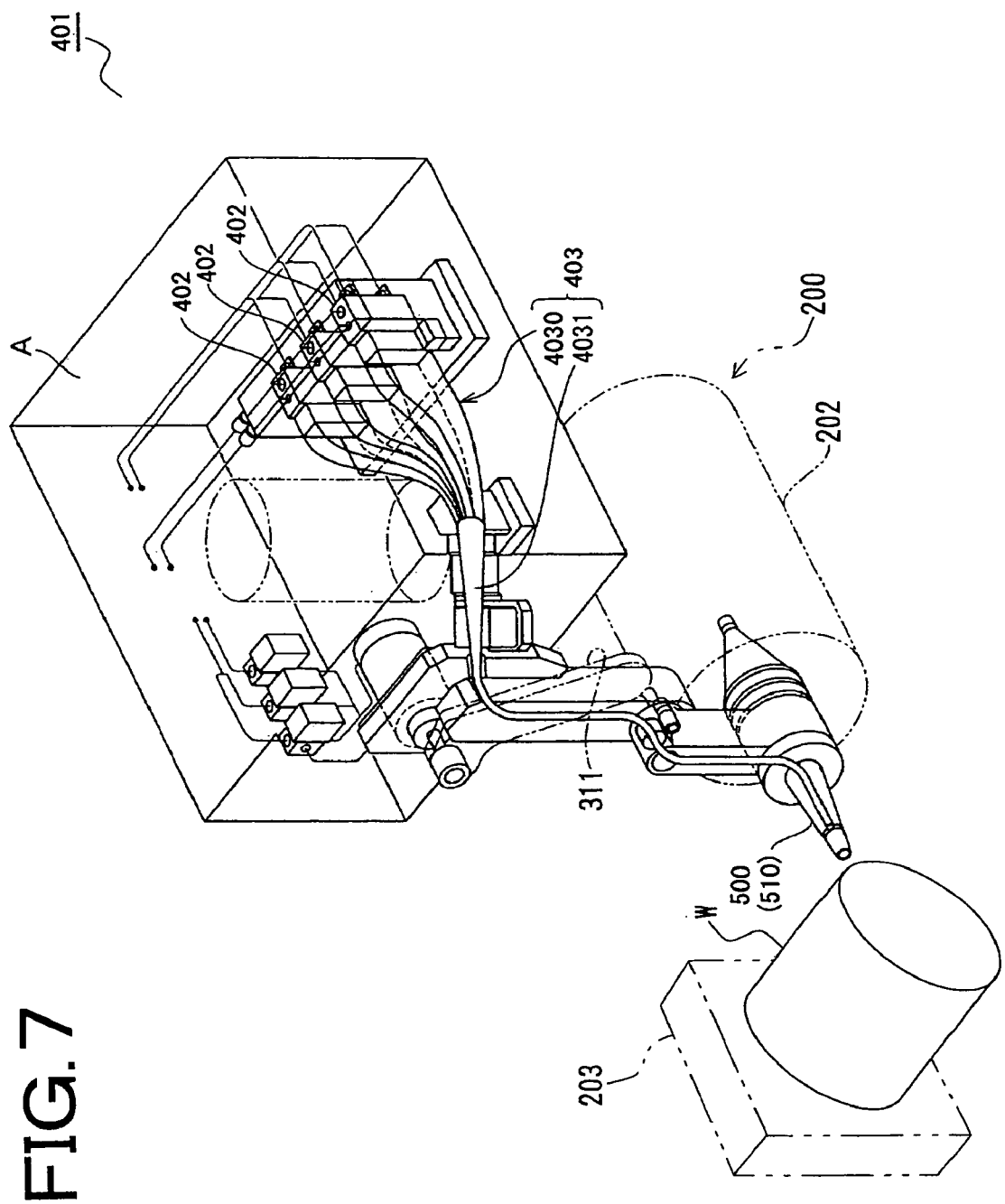
FIG. 7 is a perspective view showing an appearance of the machine tool according to the invention.
Figure 8:
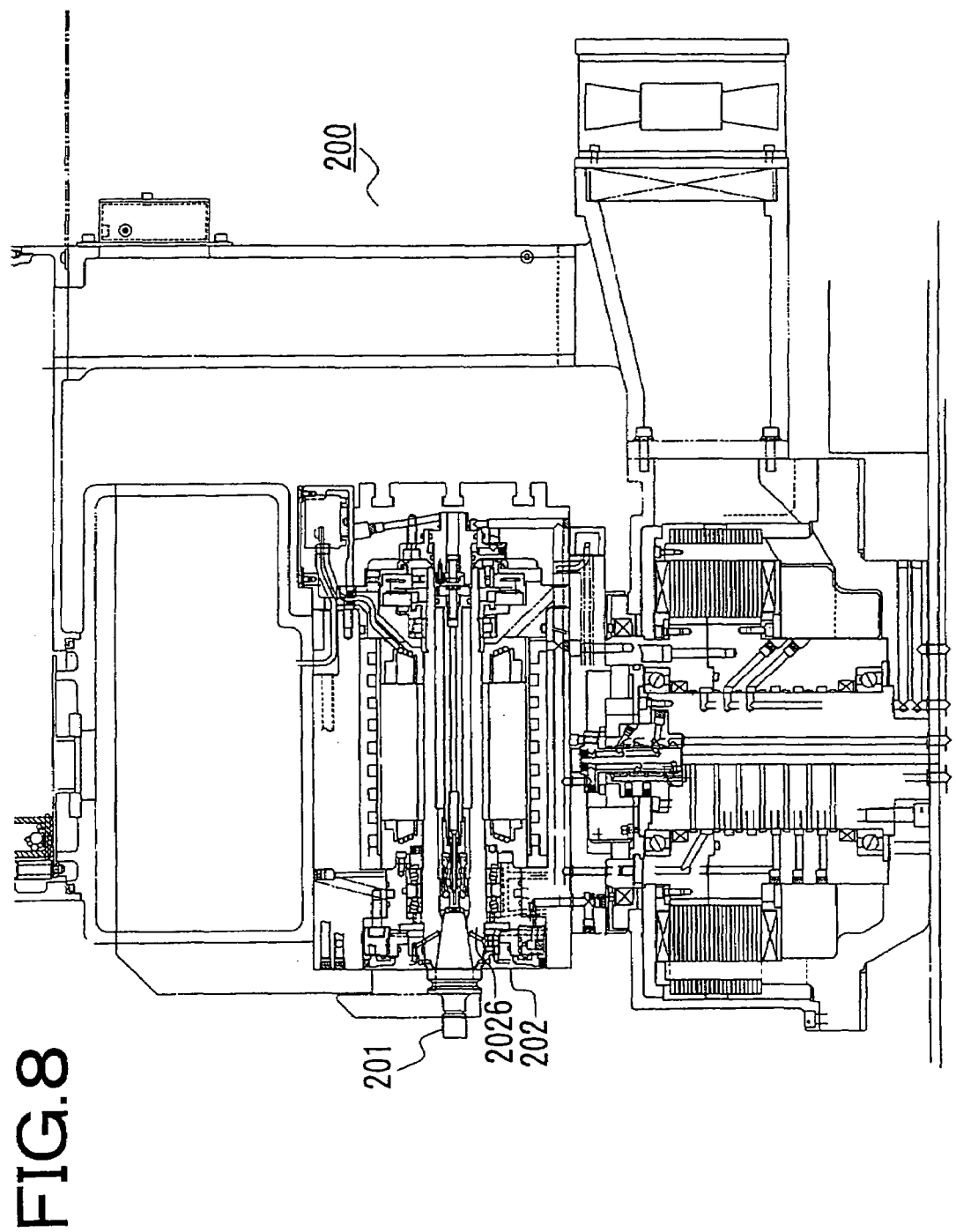
FIG. 8 is a sectional view showing the machine tool when installing a tool for cutting machining 201.
Figure 9:
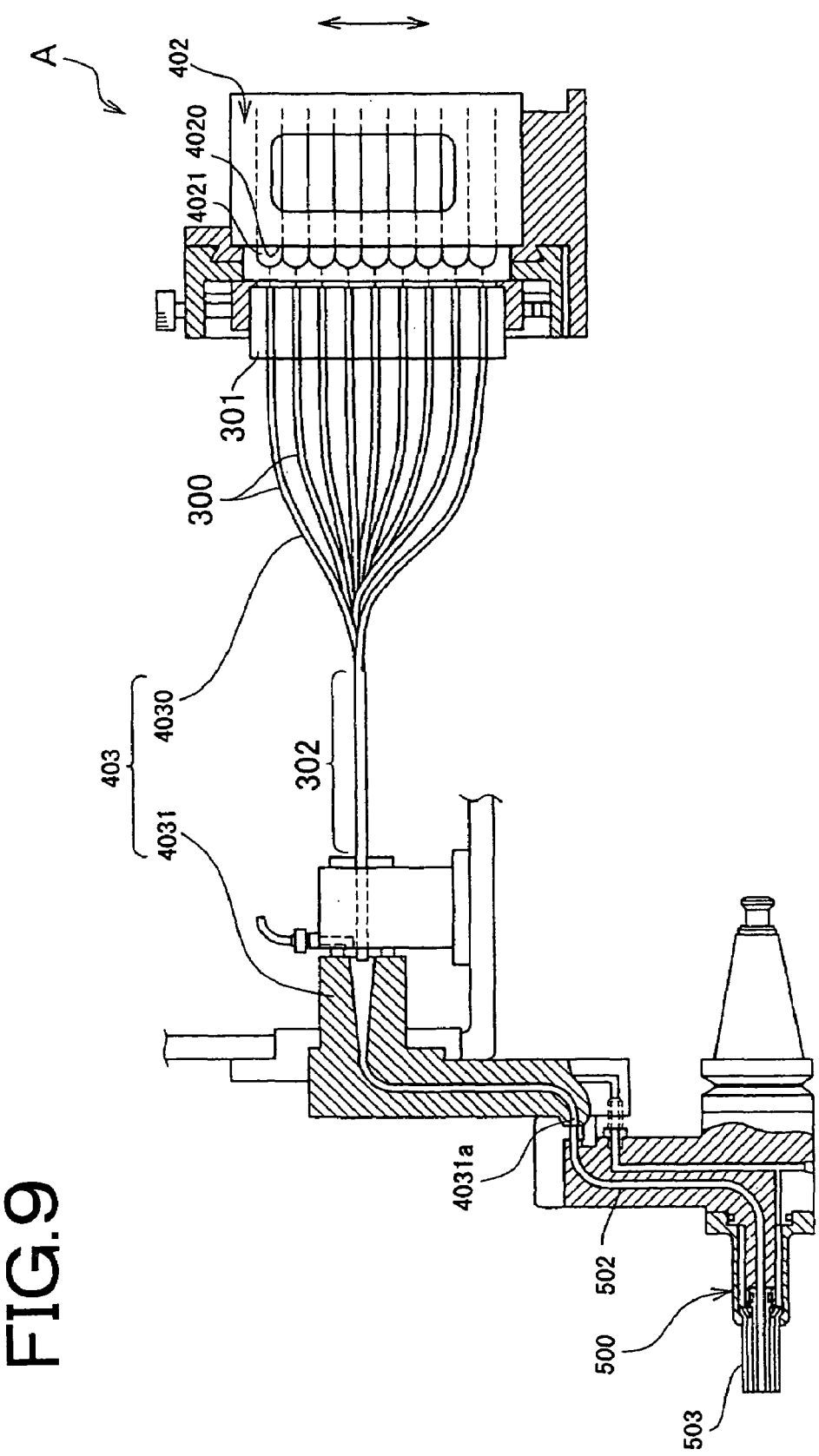
FIG. 9 is a sectional view showing structures of a laser beam generating means and a tool for radiating laser beam.
Figure 10:
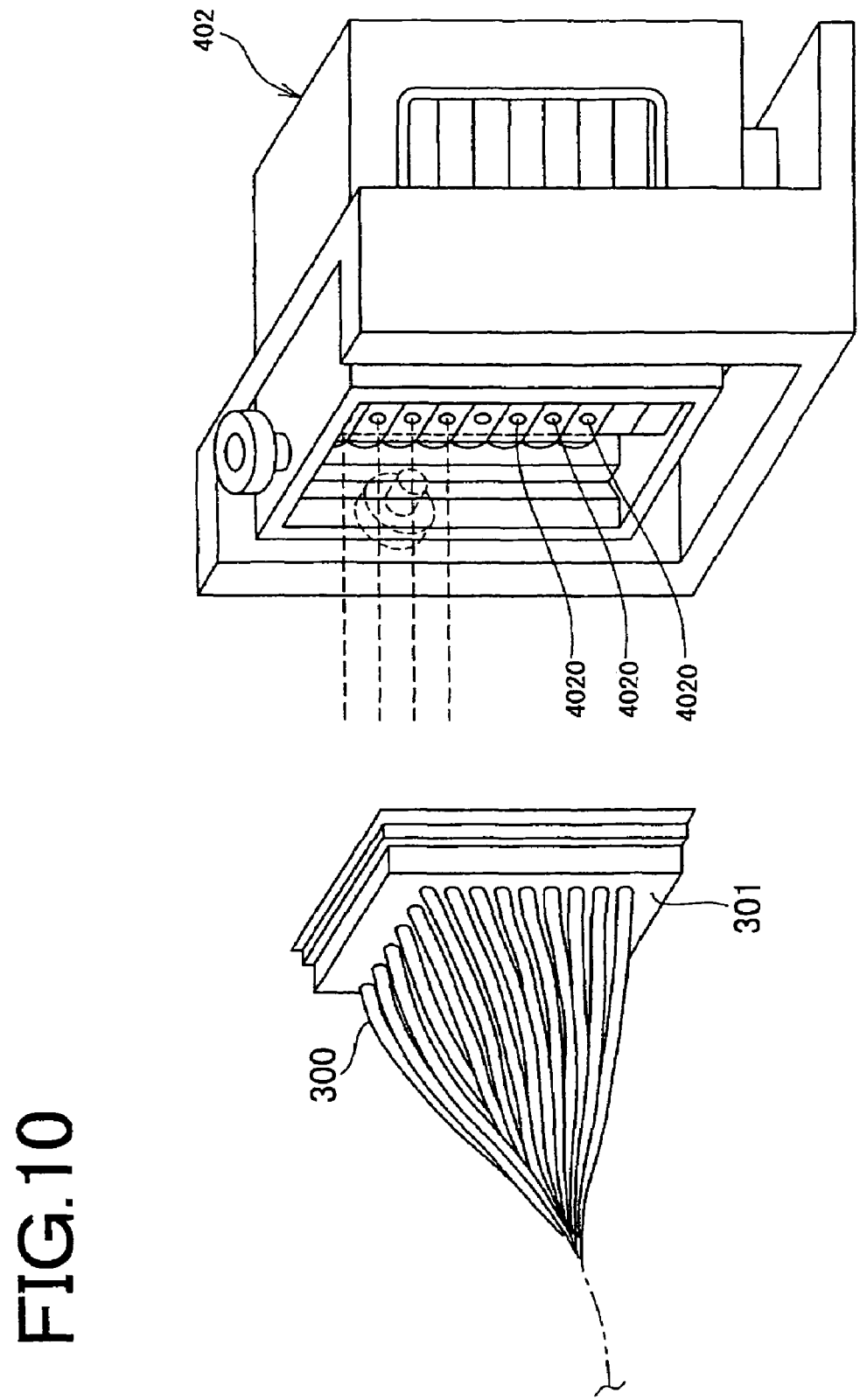
FIG. 10 is a perspective view showing an appearance of a structure of the laser beam generating means.
Figure 11:
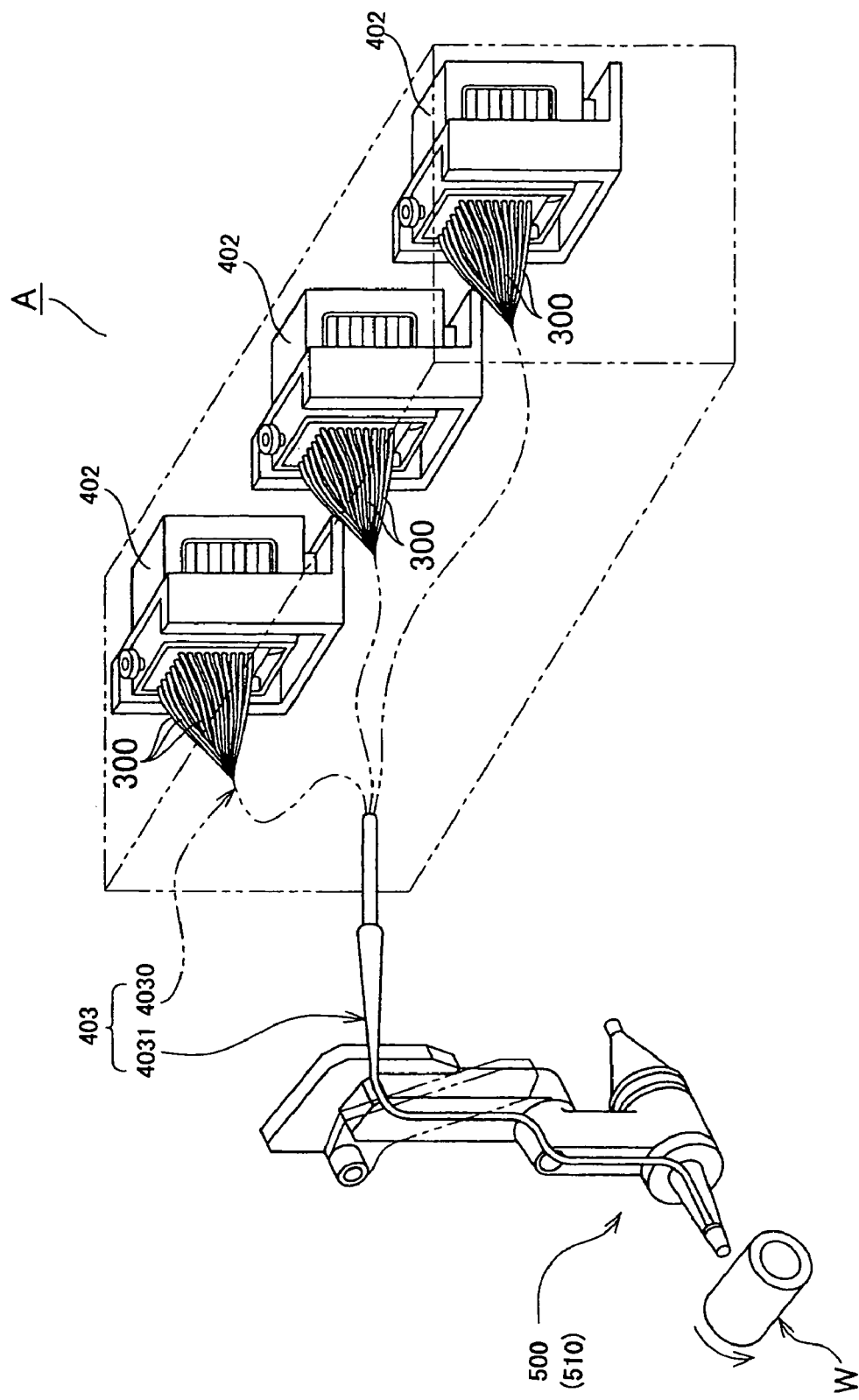
FIG. 11 is a perspective view showing appearances of structures of the laser beam generating means and the tool for radiating laser beam.
Figure 12:
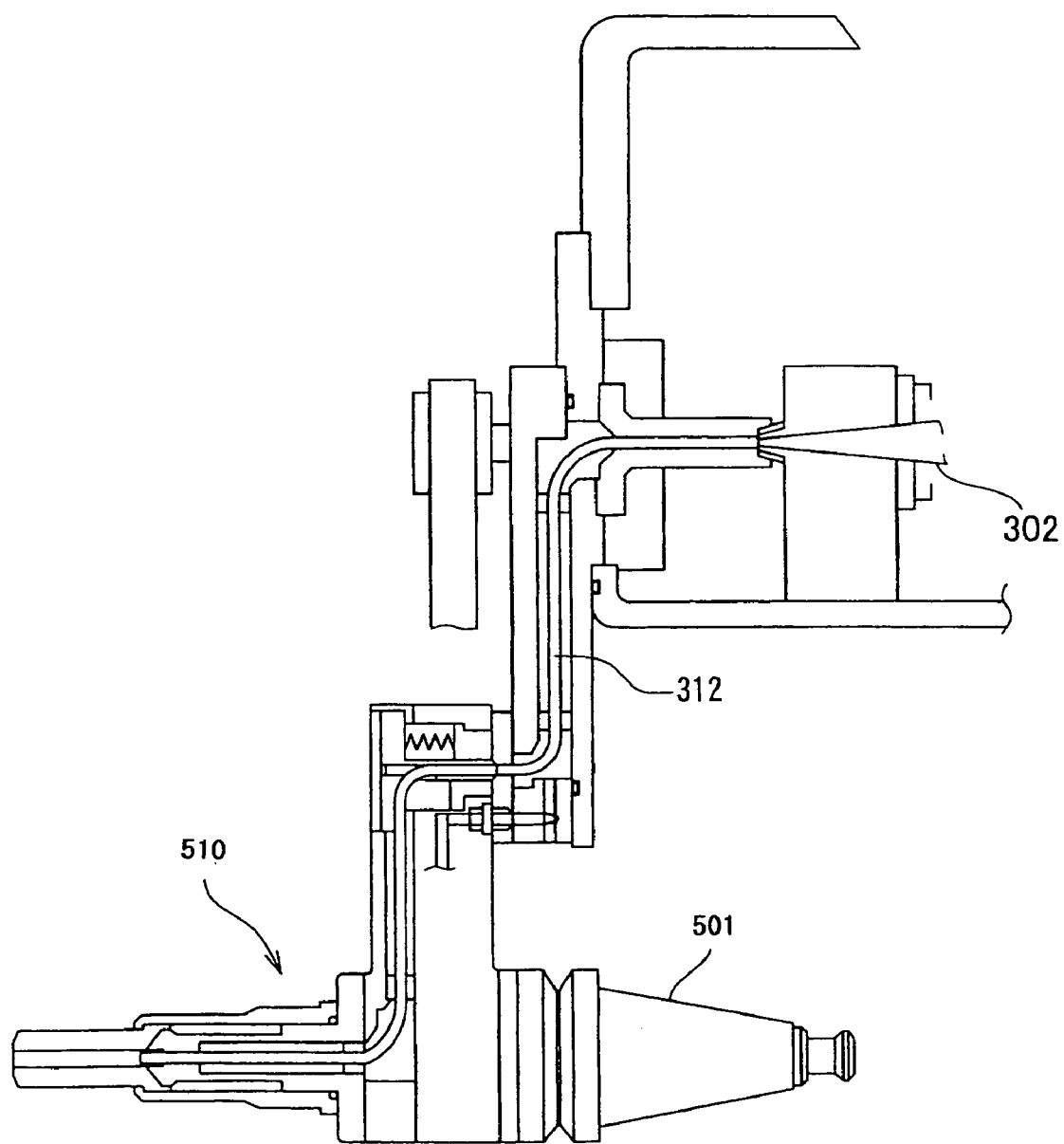
FIG. 12 is a partial sectional view showing a structure of an installation portion of the tool for radiating laser beam.
Figure 13:
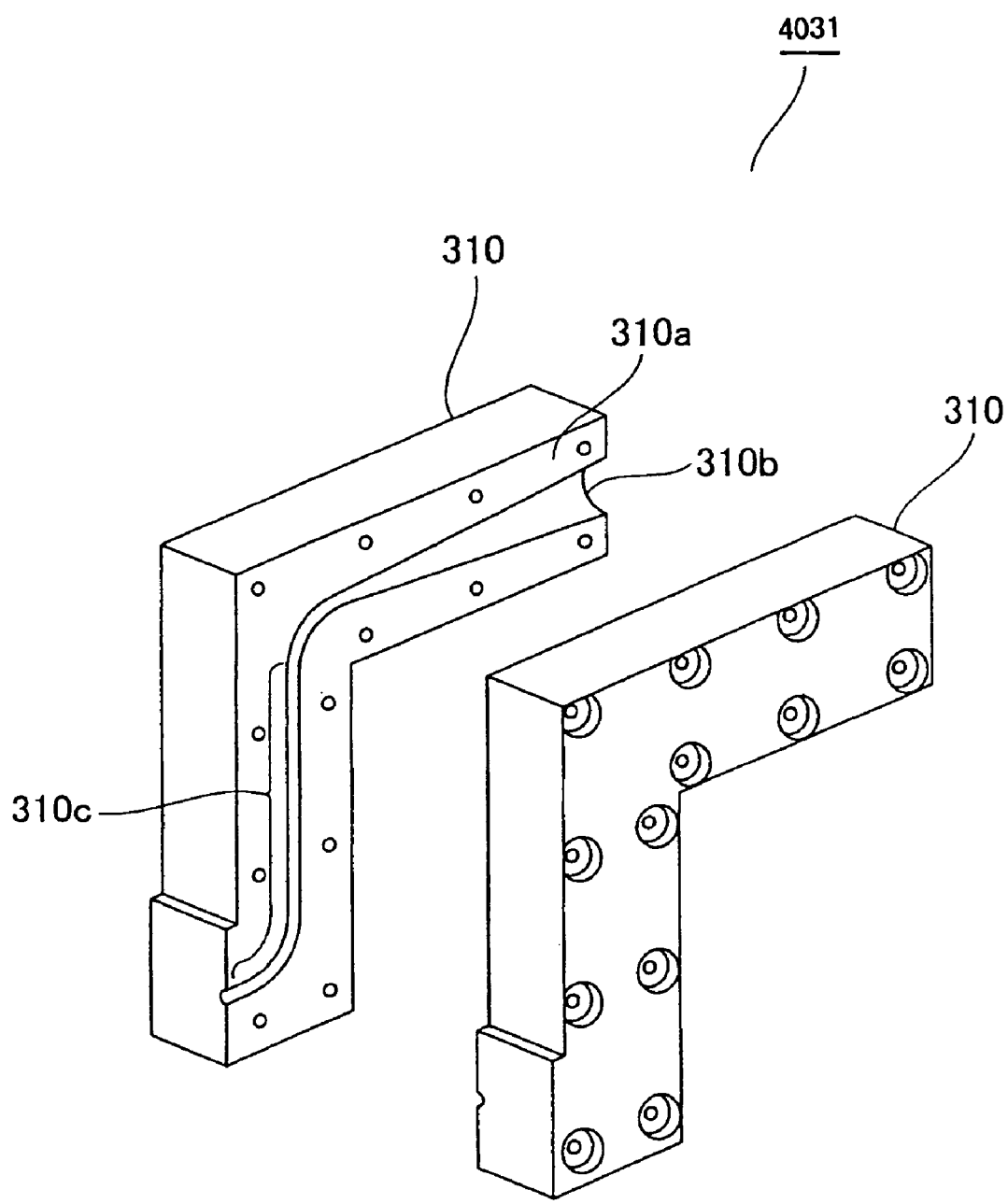
FIG. 13 is an exploded perspective view showing a structure of a second beam guide portion 4031.
Figure 14:
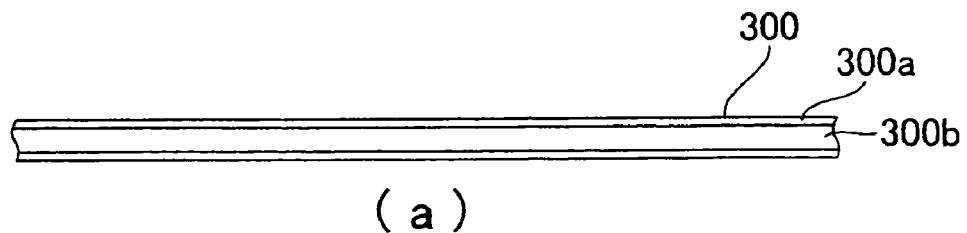
FIG. 14 is a view showing a structure of a tapered beam path portion.
Figure 14:
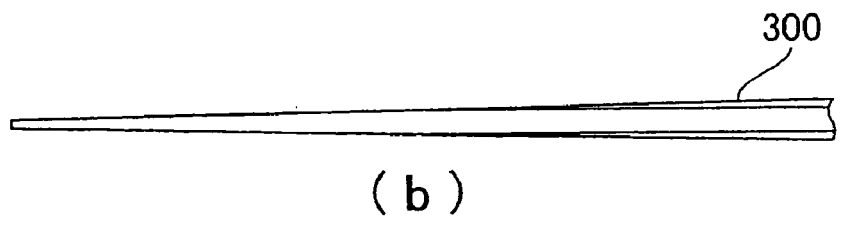
Figure 14:
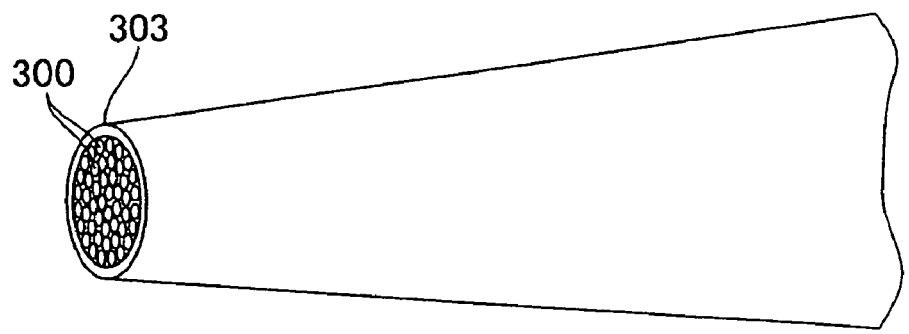
Figure 15:
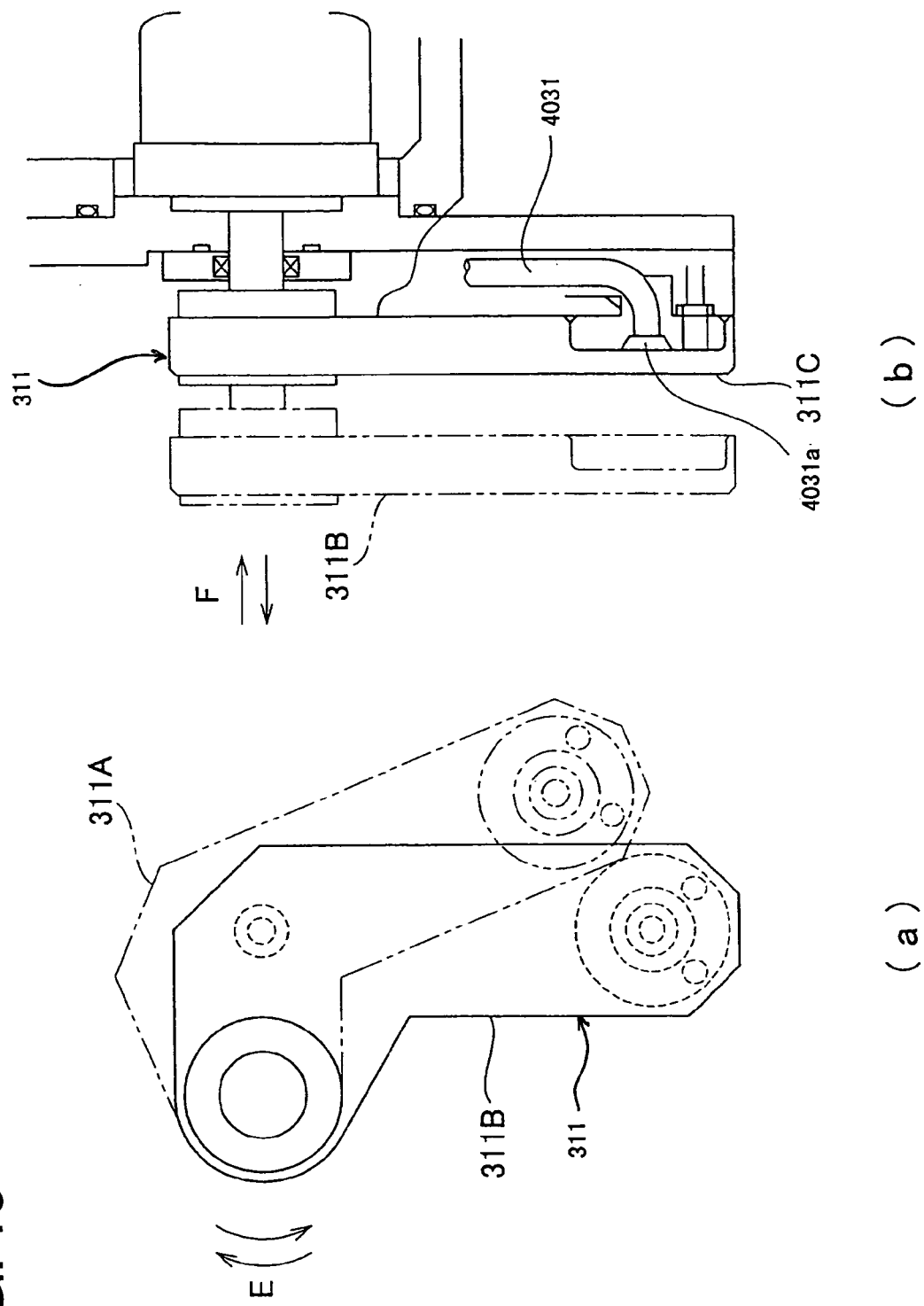
FIG. 15 is a view showing a closing mechanism in an end of an opening of the second beam guide portion 4031.

FIG. 6 is a sectional view showing a structure of a machine tool according to the invention, FIG. 7 is a perspective view showing an appearance of the machine tool according to the invention, FIG. 8 is a sectional view showing the machine tool when installing a tool for cutting machining 201, FIG. 9 is a sectional view showing structures of a laser beam generating means and a tool for radiating laser beam, FIG. 10 is a perspective view showing an appearance of a structure of the laser beam generating means, FIG. 11 is a perspective view showing appearances of structures of the laser beam generating means and the tool for radiating laser beam, FIG. 12 is a partial sectional view showing a structure of an installation portion of the tool for radiating laser beam, FIG. 13 is an exploded perspective view showing a structure of a second beam guide portion 4031, FIG. 14 is a view showing a structure of a tapered beam path portion, and FIG. 15 is a view showing a closing mechanism in an end of an opening (the tool side end portion) of the second beam guide portion 4031.

A machine tool 200 according to the invention as shown in FIGS. 6 and 7 has a workpiece holding means 203 for holding a workpiece W and a tool rest 202 for supporting a tool 201 as shown in FIG. 8.

Figure 19:
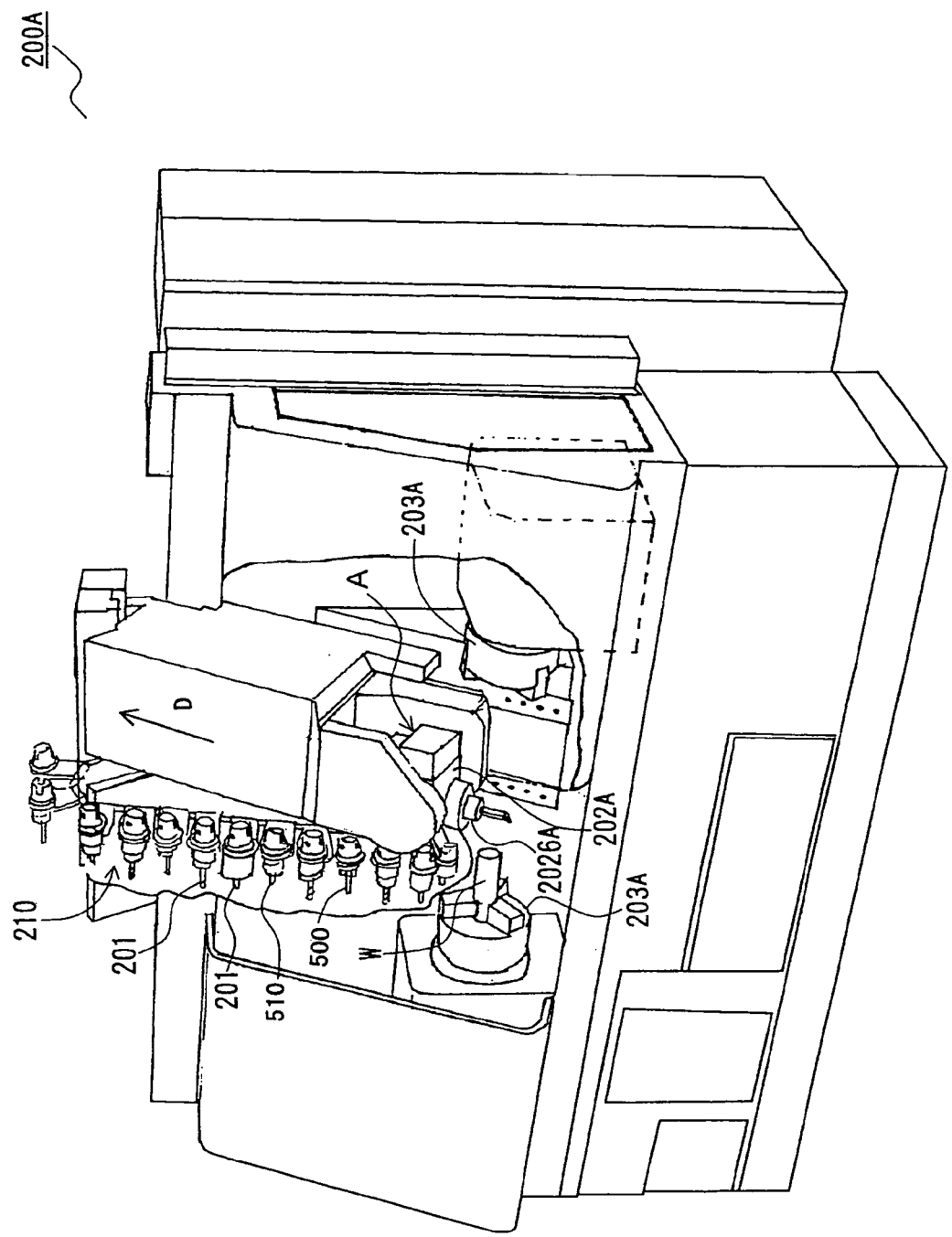
FIG. 19 is a perspective view showing the machine tool according to the invention.

Preferably, the workpiece holding means 203 can hold the stationary workpiece W, and move and rotate the workpiece W. The workpiece holding means for rotating the workpiece W are a chuck 203A as shown in FIG. 19, a tail stock (not shown) and the like.

The tool rest 202 supports at least one tool, movably between a waiting position and a machining position (a position where the workpiece W is machined). Preferably, the tool rest 202 is rotatably moved around a rotationally moving axis 202a. Preferably, the tool rest 202 has at least one tool installation portion 2026, and the tool is attachably and detachably supported by the tool installation portion 2026. A reference number 2021 of FIG. 6 denotes an axial portion, and a reference number 2022 denotes a movable portion rotatably supported by the axial portion 2021, for rotating around the rotationally moving axis 202a together with the tool installation portion 2026. A case 2023 stores the axial portion 2021 and the movable portion 2022. A core 2024 is supported on a side of the case 2023, and a coil 2025 is wound on the core 2024. And, a plurality of magnets 2027 are located at a position facing the core 2024 at an outer peripheral face of the movable portion 2022 in the peripheral direction of the movable portion 2022. When electrifying the coil 2025 with such a structure, a repulsive force or an attracting force generates between the core 2024 and the magnets 2027, through which the movable portion 2022 and the tool installation portion 2026 can be rotated to predetermined rotational positions A cooling unit 204 cools an inside of the tool rest 202 by supplying air therein. In the tool rest 202, big torque acts on the movable portion 2022, so that large volume of heat generates on the driving portion (such as the core 2024 and the coil 2025). The cooling unit 204 is effective for cooling such heat. With the cooling unit 204, thermal expansion of the core 2024 and the coil 2025 can be reduced, thereby properly keeping a gap between the core 2024 and the magnet 2027.

A laser beam generating means A for generating laser beam of FIG. 6 is located at the tool rest 202, and hardening is executed on the workpiece W held by the workpiece holding means 203 with laser beam generated from the laser beam generating means A. According to the invention, hardening can be executed with the machine tool in addition to cutting machining, thereby preventing increase of a space for locating a laser beam hardening unit. Besides, it is not necessary to move a workpiece from a machine tool to a laser beam hardening unit, thereby shortening operation time and also simplifying the operations. Preferably, such hardening is executed, while rotating the workpiece W by the workpiece holding means 203.

Preferably, the laser beam generating means A is located at a surface 202b of the tool rest 202, almost perpendicular to the rotationally moving axis 202a if the tool rest 202 is rotationally moved around the rotationally moving axis 202a. In such a case, it is sufficient to locate the laser beam generating means A in an existent empty space (that is, the surface of the tool rest almost perpendicular to the rotationally moving axis). Then, it is not necessary to secure a new location space, thereby avoiding a large sized machine tool.

Preferably, the laser beam generating means A is comprised of a semiconductor laser source 402 for emitting laser beam and a beam guide portion 403 for transmitting emitted laser beam, as detailedly shown in FIG. 9. When using the semiconductor laser source 402, the laser beam generating means A can be made smaller, and can be located at the tool rest 202.

Preferably, the semiconductor laser source 402 has a plurality of emitters 4020 which are openings for emitting laser beam, as detailedly shown in FIG. 10. The source 402 may be "an array type" wherein the emitters 4020 are arranged in a row or "a stack type" wherein a plurality of the arrays are stacked. Only one or more (as shown in FIG. 11) semiconductor laser sources 402 may be used. In FIG. 11, three sources 402 are shown, but the number may be two, four or more. Such kind of the semiconductor laser source 402 is a semiconductor laser stacked array "Light Stack" made by Coherent Inc. of the U.S.A., for instance. The array may be comprised of nineteen (19) emitters (40 W) and twenty five (25) layers of arrays may be stacked so that a total number of the emitters is 19×25=475 (40 W×25 layers=1 kW). When using three of such a laser beam stack as shown in FIG. 11, the total number of the emitters is 475×3=1425 (1 kW×3=3 kW).

Preferably, the beam guide portion 403 has a first beam guide portion 4030 comprised of a bundle of a plurality of optical fibers 300, and a second beam guide portion 4031 located so as to pass beam from the first beam guide portion 4030, as shown in FIG. 9. Preferably, the optical fiber 300 is located such that an end thereof faces the emitter 4020 in order to receive laser beam from each emitter 4020 (see FIG. 10), and laser beam emitted from each emitter 4020 is transmitted. In such a case, output of laser beam can be raised since a plurality of optical fibers 300 collects laser beam emitted from each emitter 4020. Preferably, the end portion of each optical fiber 300 in a state of being embedded in a resin 301 is located, facing each emitter 4020. Preferably, a microlens 4021 (fast axis converging lens or slow axis converging lens) located between the end portion of the optical fiber 300 and the emitter 4020 collects laser beam from the emitter 4020 on an end face of the optical fiber 300. Preferably, a sheet shaped microlens 4021 is attached to the semiconductor laser source 402 with an adhesive or by soldering. The other ends of the optical fibers 300 may be bundled. Preferably, the number of the optical fibers 300 is the same as one of the emitters 4020.

Preferably, the second beam guide portion 4031 may be a beam guiding body (see a reference number 312 of FIG. 12) having an outer peripheral face processed so as to reflect, and laser beam passes through the beam guiding body, being reflected by the outer peripheral face. Alternatively, the second beam guide portion 4031 may be a hollow path (see reference numbers 310b, 310c) formed inside a predetermined member 310 ("the path forming member" hereinafter) as shown in FIG. 13, and the inner face of the path is processed so as to reflect, and laser beam passes through the hollow path, being reflected by the inner face. Preferably, the path forming member 310 is made of metal, such as aluminium. A method of forming the hollow path is that the path forming member is formed so as to divide into a plurality of the members 310, and a groove 310b is formed at a mating face 310a, as shown in FIG. 13. Preferably, mirror finish, lapping or metal coating is carried out on the portion of the groove 310b. If the second beam guide portion 4031 is comprised of the beam guiding body, the position of the optical path of laser beam can be easily adjusted only by changing the position of the beam guiding body. If the second beam guide portion 4031 is comprised of the hollow path, the second beam guide portion can be formed by mechanical machining, and an accuracy of the position of the optical path of laser beam can be improved. If a material having superior heat conductivity is used for the predetermined material, an efficiency of cooling can be also improved.

Preferably, at least one of the first and second beam guide portions 4030, 4031 has a tapered beam path portion having a cross-section (area of a transverse section) gradually reducing along a direction of advancing laser beam, and the laser beam from the semiconductor laser source 402 is improved in its power density in a process of passing through the tapered beam path portion. With this structure, hardening with laser beam can be smoothly executed.

The tapered beam path portion may be a bundle structure comprised of a plurality of optical fibers, having a cross-section gradually reducing. Preferably, such a structure is applied to the optical fibers 300 comprising the first beam guide portion 4030 (see a reference number 302 of FIG. 12) If the number of the emitters 4020 is 1425, the number of the optical fibers 300 is necessary to be also 1425. If a diameter of one optical fiber 300 is 250 μm, the bundle diameter is 250 μm×1425=φ 11 mm. If the diameter of one optical fiber 300 is 500 μm, the bundle diameter is 500 μm×1425=φ 22 mm. When the bundle diameter remains φ 11 mm or φ 22 mm, the power density of laser beam is not raised and then, a hardening with laser can not be executed. Then, preferably, the cross section of the optical path of a bundle portion 302 is gradually reduced so that the bundle diameter becomes φ 4 through φ 5, and 100 W/mm² of power density (2 kW of output) is obtained. FIG. 14(a) shows one fiber 300 before processing to be tapered, a reference number 300a is a clad, and a reference number 300b is a core. FIG. 14(b) shows the fiber 300 after machining so as to be tapered, and FIG. 14(c) shows a bundle structure comprised of the fibers after tapering machining. A reference number 303 denotes a clad newly coated. Such bundle structure may be used for the second beam guide portion 4031, not for the first beam guide portion 4030.

Besides, a tapered fiber (see Japanese patent applications, Publication numbers are 2003-100123. 2003-75658 and 2002-289016) may be used for the tapered beam path portion.

As shown in FIG. 13, a tapered hollow path may be formed inside the predetermined member 310.

Preferably, the tool installation portion 2026 supports the tool for cutting machining (see the reference number 201 of FIG. 8), or supports a tool for emitting laser beam (reference numbers 500, 510 of FIGS. 6, 7, 9, 11 or 12) in place of the tool for cutting machining. Then, the tools for emitting laser beam 500, 510 can be detached from the tool rest 202 when not using, thereby preventing foreign objects from adhering to the tools for emitting laser beam 500, 510. Besides, the unit becomes compact since a single tool installation portion 2026 can support both the tool for cutting machining 201 and the tools for emitting laser beam 500, 510. Preferably, the beam guide portion 403 is located, extending from a portion near the semiconductor laser source 402 and to a portion near the tool installation portion 2026, and has a tool side end portion 4031a near the tool installation portion 2026, and the tool for emitting laser beam 500 or 510 connects with the tool side end portion 4031a, being supported by the tool installation portion 2026, so that laser beam supplied from the semiconductor laser source 402 is radiated on the workpiece W.

When detaching the tools for emitting laser beam 500, 510 in a structure wherein the tools can be detached, it is necessary to close the tool side end portion 4031a of the beam guide portion 403 in order not to adhere or enter foreign objects, such as oil mist in the air. Preferably, a shutter means for opening and closing the tool side end portion 4031a is provided so as to open the end portion 4031a when contacting the tools for emitting leaser beam 500, 510 with the tool side end portion 4031a, and so as to close the tool side end portion 4031a when detaching the tools for emitting laser beam 500, 510 from the end portion 4031a in order to save attachment of foreign objects to the end portion. Concretely speaking, a shutter means 311 may be provided so as to be moved to a closed position 311c for closing the tool side end portion 4031a and an opened position 311A for opening the end portion 4031a, as shown in FIG. 15. That is, the shutter means 311 may be rotationally movable in a direction of a reference number E, and may enter or come out in an axial direction of the rotational axis as shown with a reference number F. Then, the end portion 4031a of the beam guide portion 403 is opened so as to connect with the tools for emitting laser beam 500, 510 in a state of 311A, and the end portion 4031a is closed in a state of 311C after moving from 311B so as not to enter foreign objects into the end portion 4031a or adhere foreign objects to the end portion 4031a. In the end, it is possible to avoid power down of laser beam due to presence of the foreign objects. Besides, the structure is simple if the shutter means is one shown in FIG. 15.

The machine tool may be one shown in FIG. 19. That is, the workpiece holding means 203A rotates the held workpiece W, and a tool rest 202A has a tool installation portion 2026A. And, an automatic tool changer (not shown) may be located at a position facing the tool installation portion 2026A (such as a position corresponding to a mechanical origin of the tool rest 202A which is provided on a side of a direction D of FIG. 19, and the automatic tool changer attaches and detaches the tool for cutting machining and the tools for emitting laser beam to and from the tool installation portion 2026A. Then, cutting machining can be performed on the rotating workpiece W when installing the tool for cutting machining on the tool installation portion 2026A, and a hardening can be performed on the rotating workpiece W when installing the tool for emitting laser beam on the tool installation portion 2026A. Preferably, a stock portion (ATC tool magazine) 210 having a plurality of the tools for cutting machining and for emitting laser beam is provided, and the tool stocked by the stock portion 210 is installed in the tool installation portion 2026A by the automatic tool changer. Preferably, the stock portion 210 has such a structure that a tool to be newly installed according to machining program is transferred to a position facing the automatic tool changer.

Figure 16:
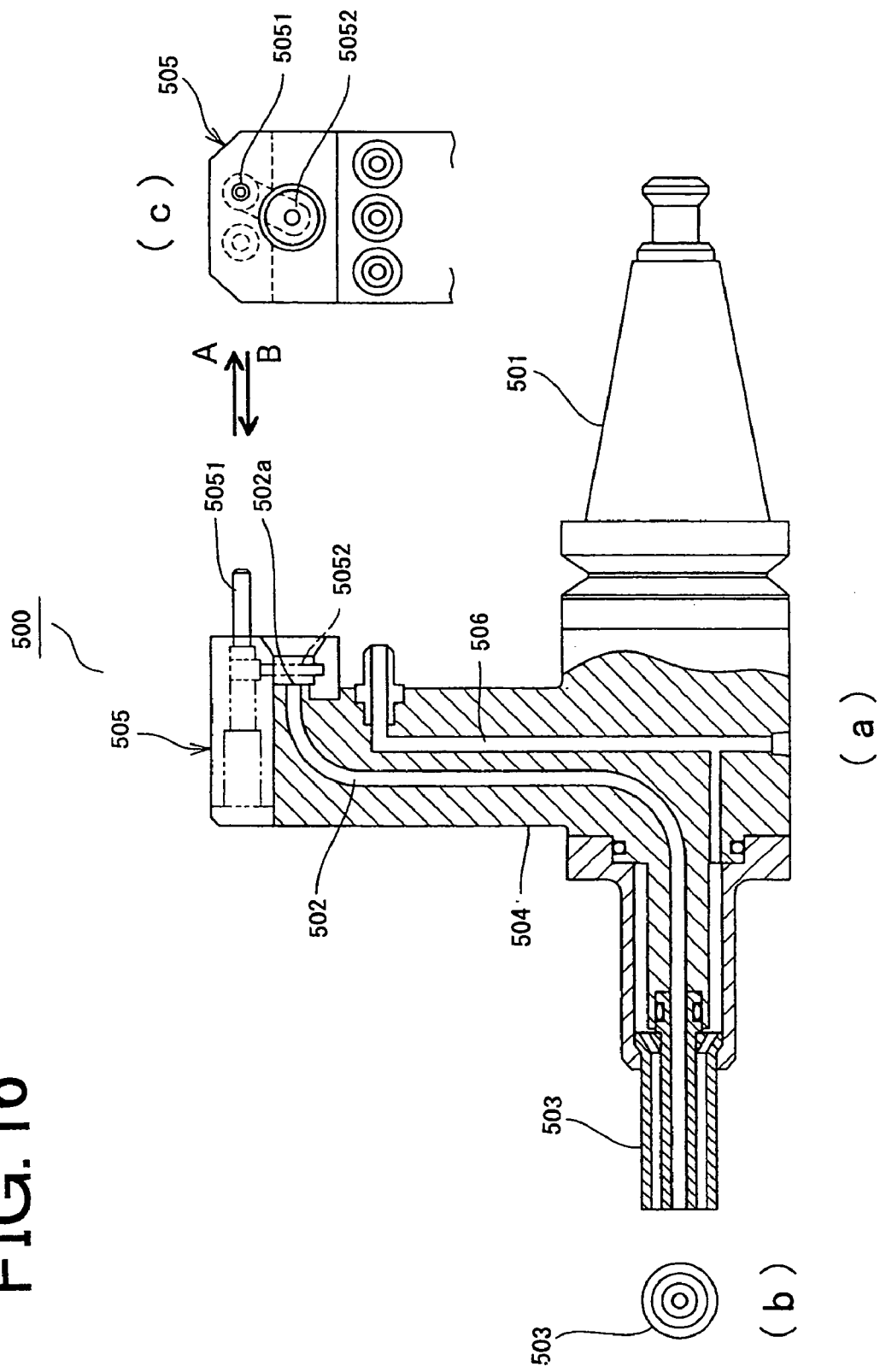
FIG. 16(a) is a partial sectional view showing a structure of the tool for radiating laser beam.
FIG. 16(b) is a side view showing a structure of a torch portion 503.
FIG. 16(c) is a side view showing a structure of a shutter means 505.
Figure 17:
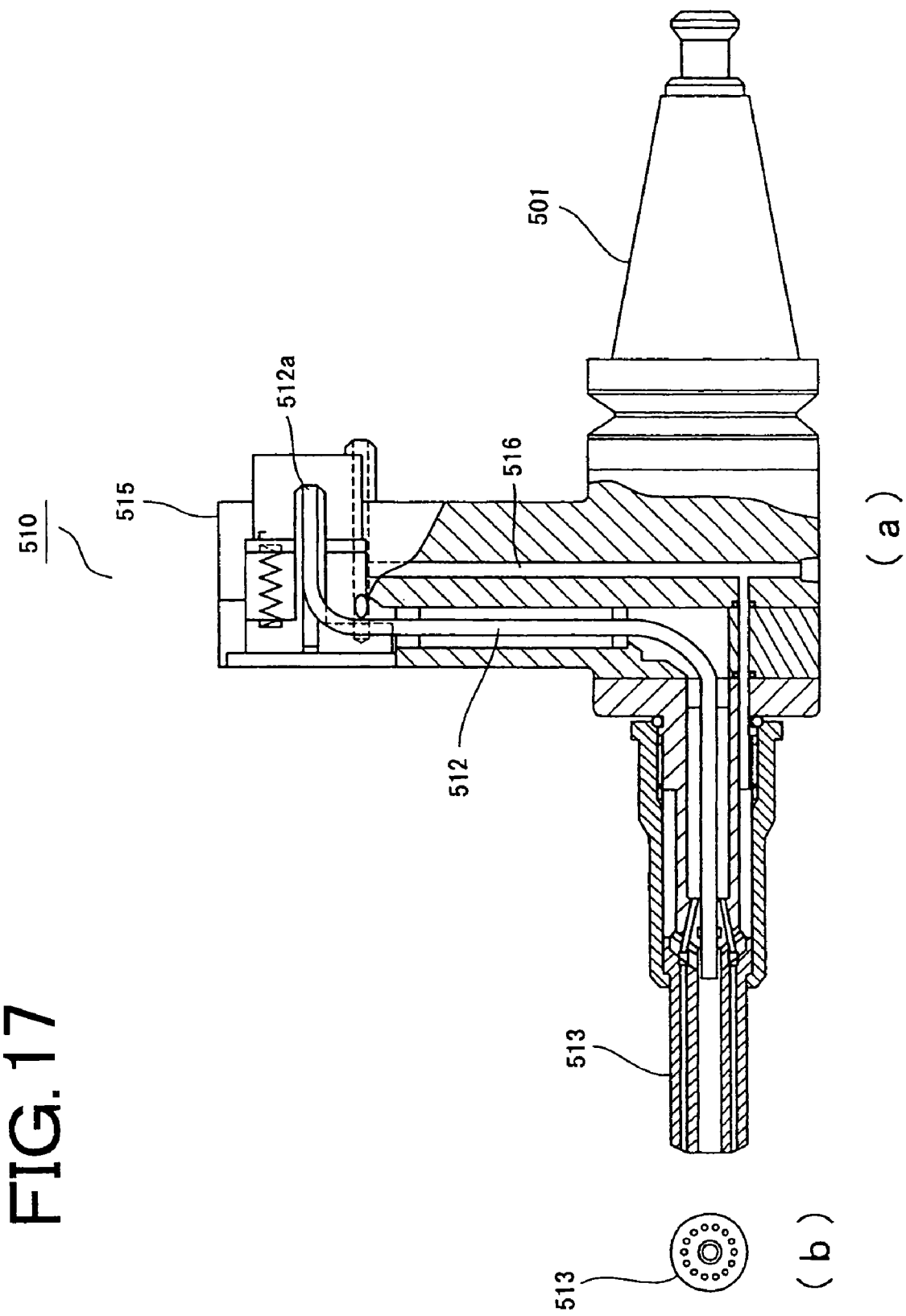
FIG. 17(a) is a partial sectional view showing another structure of the tool for radiating laser beam.
FIG. 17(b) is a side view showing a structure of a torch portion 513.
Figure 18:
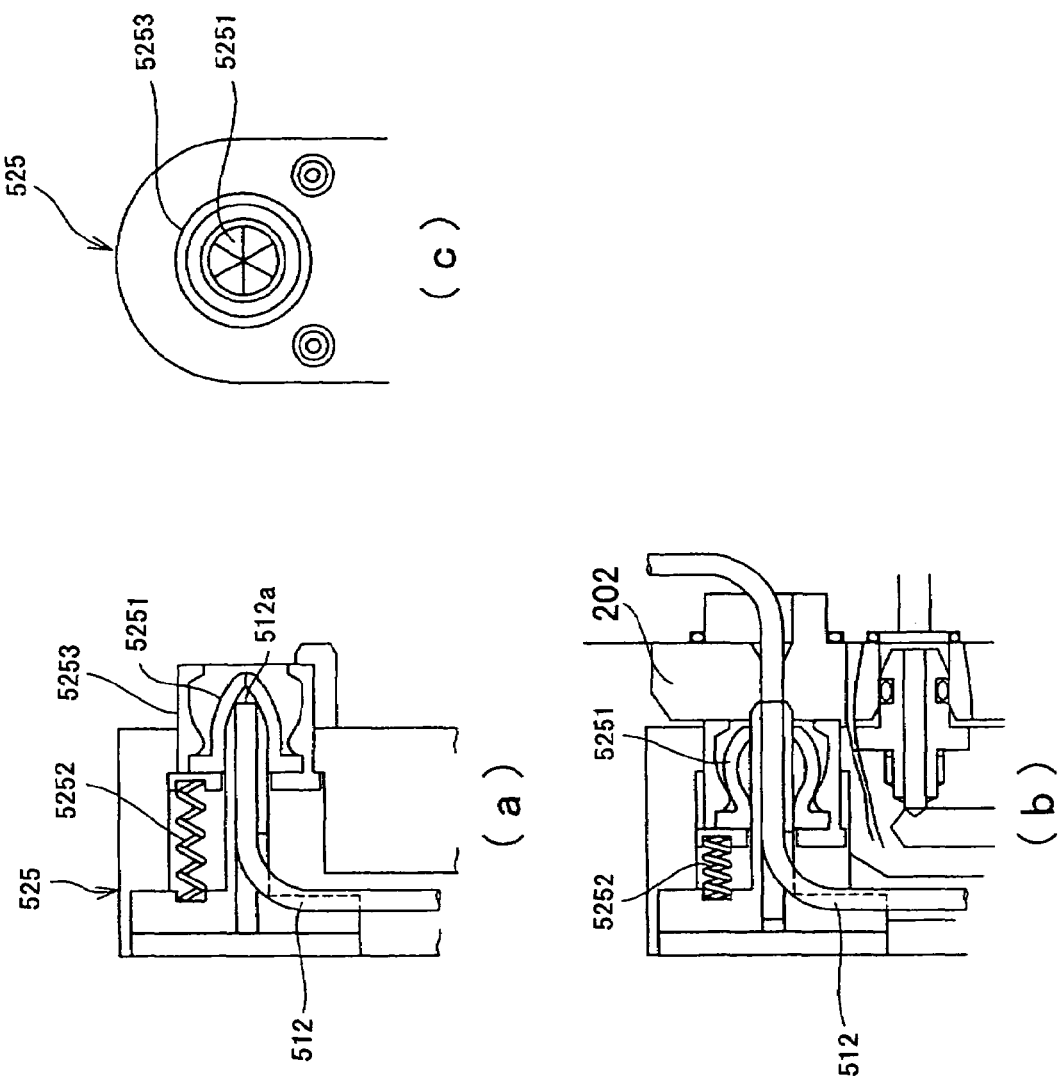
FIG. 18 is a view showing a structure of the shutter means for properly closing an end portion of a beam guide path (a path of laser beam) wherein (a) is a sectional view showing a state of a closed position, (b) is a sectional view showing a state of an opened position, and (c) is a side view showing a state of the closed position.

The tool for emitting laser beam is now explained, referring to FIGS. 16 through 18. FIG. 16(a) is a partial sectional view showing a structure of the tool for radiating laser beam, FIG. 16(b) is a side view showing a structure of a torch portion 503, and FIG. 16(c) is a side view showing a structure of a shutter means 505. FIG. 17(a) is a partial sectional view showing another structure of the tool for radiating laser beam, and FIG. 17(b) is a side view showing a structure of a torch portion 513. FIG. 18 is a view showing a structure of the shutter means for properly closing an end portion of a beam guide path (a path of laser beam) wherein (a) is a sectional view showing a state of a closed position, (b) is a sectional view showing a state of an opened position, and (c) is a side view showing a state of the closed position.

The tool for emitting laser beam 500 has a shape as shown in FIG. 16(a), and has an engagement portion 501 for engaging with the tool rest 202 of the machine tool 200, a beam guide path 502 which is a path of laser beam supplied, and a torch portion 503 for emitting laser beam passed through the beam guide path 502 on the workpiece W.

The beam guide path 502 is a hollow path which is formed inside a predetermined member 504, and an inner face of the path is preferably processed so as to reflect. With such a structure, laser beam passes through the hollow path, being reflected by the inner face. The processing of reflecting is lapping, mirror finish, or coating with gold or silver. The member 504 may be made of metal, such as aluminium. A method of forming the hollow path is that the member 504 is divided into a plurality of members, and a groove is formed at a mating face. If the member 504 is divided into a plurality of members, it is necessary that beam does not escape from a gap of the mating face. If the beam guide path is the hollow path 502, the beam guide path can be formed by mechanical machining, and an accuracy of the position can be improved.

The beam guide path may be comprised of a beam guiding body 512 having an outer peripheral face processed so as to reflect, as shown in FIG. 17(a), not be comprised of the hollow path. In this case, laser beam passes through the beam guiding body 512, being reflected by the outer peripheral face. The processing to reflect is coating with gold or silver, for instance. The beam guiding body is a glass, for instance. When forming the beam guide path with the beam guiding body 512, the position of the optical path of laser beam can be easily adjusted only by change of a position of the beam guiding body 512.

Preferably, a shutter means (reference number 505 in FIG. 16(a), 515 of FIG. 17(a) and 525 of FIG. 18) is located at an end portion of the beam guide path 502 or 512 in such a manner that an end portion 502a or 512a of the beam guide path 502 or 512 is opened so as to allow supply of laser beam when engaging the engagement portion 501 with the tool rest 202, and the end portion 502a or 512a of the beam guide path 502 or 512 is closed so as to restrict attachment of foreign objects to the end portion or enter of foreign objects in the end portion when not engaging the engagement portion 501 with the tool rest 202. In case of a machine tool, oil mist generally floats in the air. The above-mentioned shutter means 505, 515, 525 are very proper for restricting attachment of oil mist to the beam guide path 502, 512 and enter of oil mist in the beam guide path 502, 512. And, power down of laser beam due to the presence of the foreign objects in the beam guide path can be avoided when using the tool for emitting laser beam.

The shutter means may be one as shown in FIG. 16 (a) and (c), or as shown in FIG. 18.

The shutter means 505 as shown in FIG. 16(a) and (c) is comprised of an axial portion 5051 and a shutter member 5052 attached to the axial portion 5051. When moving the axial portion 5051 in a direction as shown by arrows A and B, the shutter member 5052 selectively moves to a rotational position for opening the end portion 502a of the beam guide path and a rotational position for closing the end portion 502a of the beam guide portion through a cam mechanism (not shown).

The shutter means 525 as shown in FIG. 18(a), (b) and (c) is comprised of a shutter member 5251 movable to a closed position for closing the end portion 512a of the beam guide path 512 (see FIG. 18(a) and (c)) and an opened position for opening the end portion 512a (see FIG. 18(b)), and a spring member 5252 for energizing the shutter member 5251 to the closed position. The shutter member 5251 is moved to the opened position against the spring member 5252 when engaging the engagement portion 501 with the tool rest 202, as shown in FIG. 18(b), and is moved to the closed position by an energizing force of the spring member 5252 when detaching the engagement portion 501 from the tool rest 202. The shutter member 5251 may be formed with a rubber plate having a restoring force, and may be held by a member 5253 having almost cylindrical shape. If the shutter means is structured as shown in FIG. 16 or FIG. 18, the members 5051, 5253 abut on the tool rest 202 so as to freely move the shutter members 5052, 5251 when attaching/detaching the tool for emitting laser beam to/from the machine tool, so that an operation for moving the member 5251 is not necessary, thereby avoiding an error operation and never failing to operate.

Preferably, cooling paths 506, 516 in which fluid flows are formed near the beam guide paths 502, 512. In this case, heat generated due to passage of laser beam can be restricted. Fluid may be liquid (such as water) or gas. If the cooling path 506, 516 is opened at a position facing the workpiece W and gas is injected on the workpiece W, it is possible to remove foreign objects on a surface of the workpiece, to avoid oxidizing the workpiece, and to cool. In case where a hardening with laser beam is performed after cutting machining, it is possible to remove water for cutting and cutting chips which remain on the surface of a workpiece, thereby improving a quality of machining with laser beam. When overheating the workpiece during a hardening, an efficiency of hardening reduces. In such a case, the workpiece is cooled with air purging so as to reduce decrease of the efficiency of hardening. If inert gas is used for gas, it is possible to shield a portion hardened.

The present invention has been explained on the basis of the example embodiments discussed. Although some variations have been mentioned, the embodiments which are described in the specification are illustrative and not limiting. The scope of the invention is designated by the accompanying claims and is not restricted by the descriptions of the specific embodiments. Accordingly, all the transformations and changes within the scope of the claims are to be construed as included in the scope of the present invention.

INDUSTRIAL APPLICABILITY

The present invention can be applied to various kinds of machines for obtaining a predetermined output of laser beam by collecting laser beam emitted from many semiconductor lasers.

The invention claimed is:

1. A laser beam generating unit having a semiconductor laser unit equipped with a plurality of beam emitting portions arranged in the shape of a matrix, each beam emitting portion being capable of emitting a laser beam, and a laser beam collecting means for collecting laser beams emitted from a plurality of said beam emitting portions, said laser beam collecting means comprising:

an optical fiber bundle made by binding a plurality of optical fibers for idividually transmitting laser beams respectively emitted from a plurality of said beam emitting portions on a side where said laser beam is emitted, which is opposite to a laser beam receiving end facing a plurality of said beam emitting portions;

a member having an emission entrance through which said laser beams collected by said optical fiber bundle enters, an emission exit in communication with said emission entrance, and a tapered groove connecting the emission entrance to the emission exit, said tapered groove formed so as to have a diameter that gradually decreases when moving from said emission entrance to said emission exit;

wherein said tapered groove is polished or has a reflecting film; and wherein a power density of said laser beam emitted from said optical fiber bundle is enhanced within said tapered groove.

2. The laser beam generating unit according to claim 1, wherein a shape of a cross section of said laser beam collected by said optical fiber bundle is equal to a shape of said emission entrance opening or smaller.

3. The laser beam generating unit according to claim 1, wherein said tapered groove is bent between said emission entrance and said emission exit.

4. The laser beam generating unit according to claim 1, wherein said member is divided into a plurality of parts having mating faces, and said tapered groove is formed by the mating faces of said plurality of parts.

* * * * *